United States Patent [19]
Shimizu et al.

[11] Patent Number: 6,066,881
[45] Date of Patent: May 23, 2000

[54] INTEGRATED CIRCUIT HAVING A MEMORY CELL TRANSISTOR WITH A GATE OXIDE LAYER WHICH IS THICKER THAN THE GATE OXIDE LAYER OF A PERIPHERAL CIRCUIT TRANSISTOR

[75] Inventors: Masahiro Shimizu; Yoshinori Tanaka; Hideaki Arima, all of Hyogo, Japan

[73] Assignee: Mitsubishi Denki Kabushiki Kaisha, Tokyo, Japan

[21] Appl. No.: 09/119,053

[22] Filed: Jul. 20, 1998

[30] Foreign Application Priority Data

Jan. 29, 1998 [JP] Japan .................................. 10-017232

[51] Int. Cl.[7] ................................................ H01L 29/772
[52] U.S. Cl. .......................... 257/392; 257/296; 257/404; 257/401
[58] Field of Search ..................... 257/391, 392, 257/344, 296, 339, 335, 336, 345, 369, 401, 404

[56] References Cited

U.S. PATENT DOCUMENTS

| | | | |
|---|---|---|---|
| 4,033,026 | 7/1977 | Pashley | 29/571 |
| 4,472,871 | 9/1984 | Green et al. | 29/571 |
| 4,700,212 | 10/1987 | Okazawa | 357/41 |
| 5,148,255 | 9/1992 | Nakazato et al. | 357/43 |
| 5,210,436 | 5/1993 | Kakizoe et al. | 257/361 |
| 5,217,910 | 6/1993 | Shimizu et al. . | |
| 5,250,832 | 10/1993 | Murai . | |
| 5,285,096 | 2/1994 | Ando et al. | 257/379 |
| 5,320,976 | 6/1994 | Chin et al. | 437/48 |
| 5,323,343 | 6/1994 | Ogoh et al. | 365/149 |
| 5,329,482 | 7/1994 | Nakajima et al. | 365/182 |
| 5,334,869 | 8/1994 | Iguchi et al. | 257/309 |
| 5,396,098 | 3/1995 | Kim et al. | 257/344 |
| 5,497,021 | 3/1996 | Tada | 257/369 |
| 5,512,771 | 4/1996 | Hiroki et al. | 257/369 |
| 5,548,148 | 8/1996 | Bindal | 257/335 |
| 5,631,485 | 5/1997 | Wei et al. | 257/344 |
| 5,656,853 | 8/1997 | Ooishi | 257/647 |
| 5,751,037 | 5/1998 | Aozasa et al. | 257/315 |
| 5,763,921 | 6/1998 | Okumura et al. | 257/371 |
| 5,945,715 | 8/1999 | Kuriyama | 257/369 |

FOREIGN PATENT DOCUMENTS

| | | |
|---|---|---|
| 54-058386 | 5/1979 | Japan . |
| 4-134859 | 5/1992 | Japan . |
| 4-345065 | 12/1992 | Japan . |

*Primary Examiner*—Jerome Jackson, Jr.
*Assistant Examiner*—Bradley William Baumeister
*Attorney, Agent, or Firm*—McDermott, Will & Emery

[57] ABSTRACT

A gate insulating film in a memory cell portion is thicker than a gate insulating film in a peripheral circuitry. Source/drain of an MOS transistor in the memory cell portion have double-diffusion-layer structures, respectively, and source/drain of an MOS transistor in the peripheral circuitry have triple-diffusion-layer structures, respectively.

9 Claims, 36 Drawing Sheets

MEMORY CELL PORTION

PERIPHERAL CIRCUITRY

MEMORY CELL PORTION

PERIPHERAL CIRCUITRY

MEMORY CELL PORTION

PERIPHERAL CIRCUITRY

MEMORY CELL PORTION

PERIPHERAL CIRCUITRY

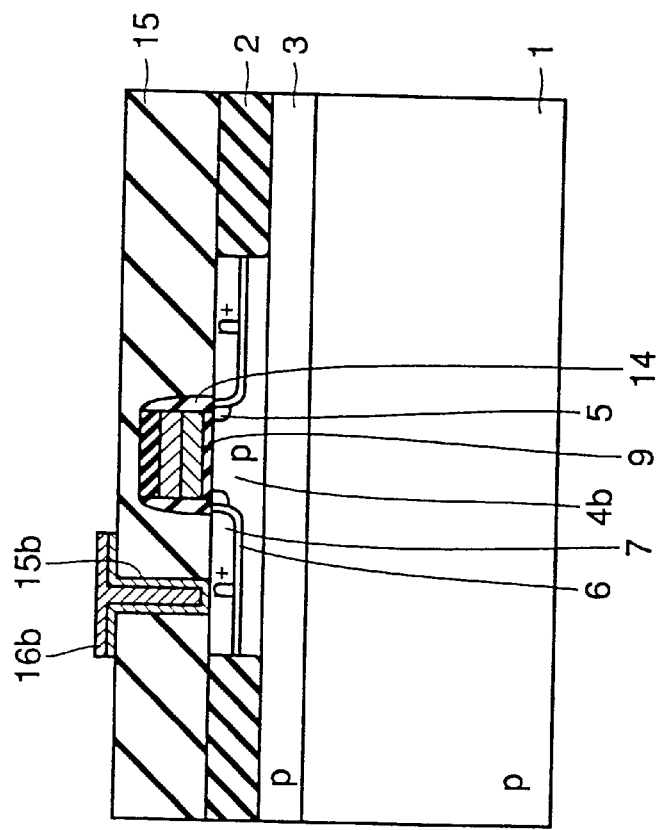
FIG. 8B PERIPHERAL CIRCUITRY
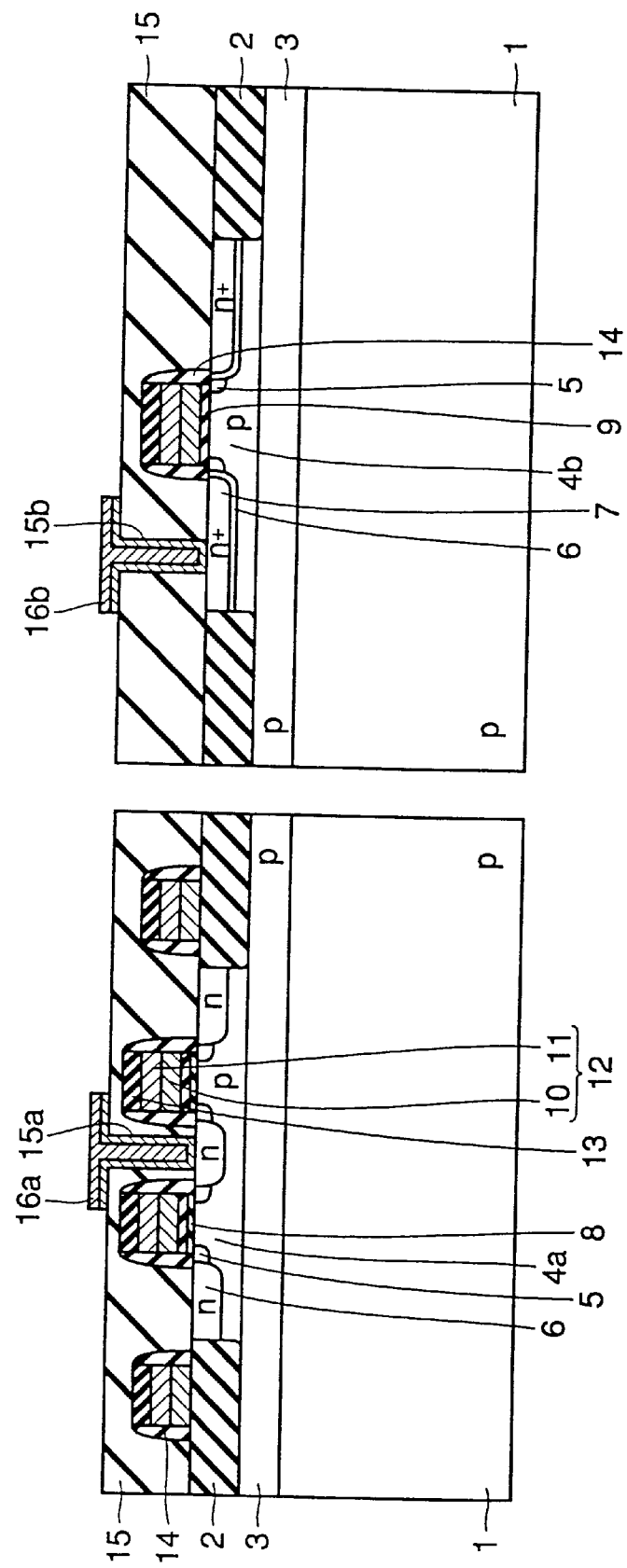
FIG. 8A MEMORY CELL PORTION

MEMORY CELL PORTION

PERIPHERAL CIRCUITRY

MEMORY CELL PORTION

PERIPHERAL CIRCUITRY

FIG. 14A
MEMORY CELL PORTION
FIG. 14B
PERIPHERAL CIRCUITRY
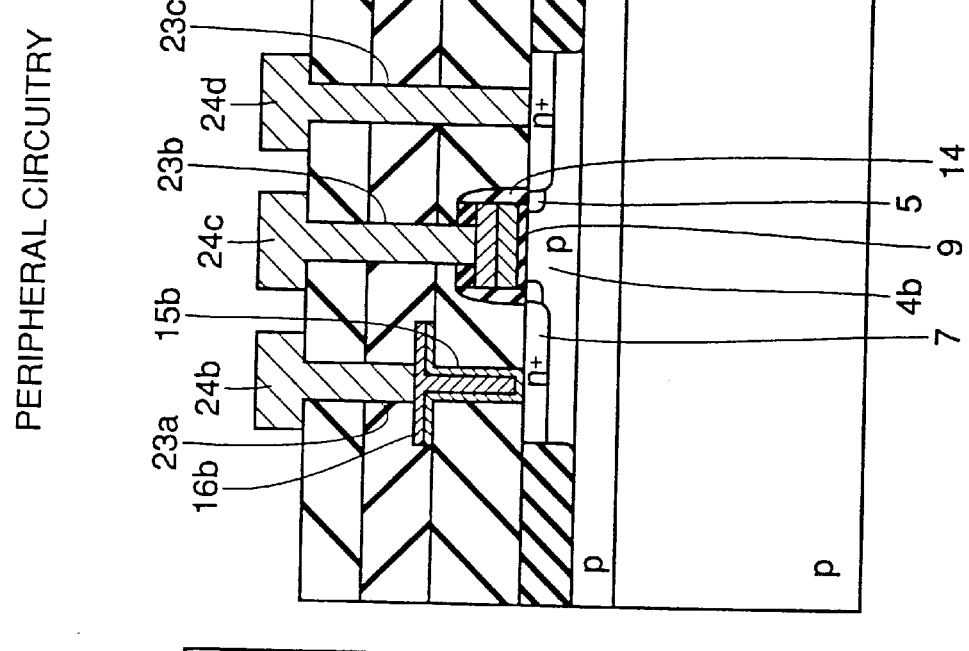
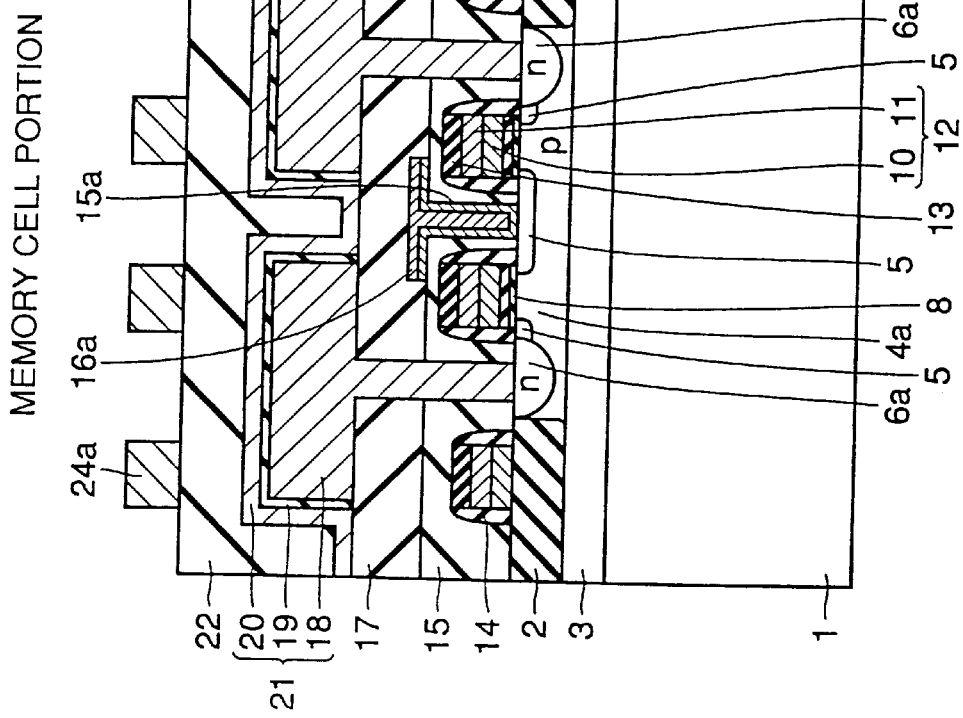

MEMORY CELL PORTION

PERIPHERAL CIRCUITRY

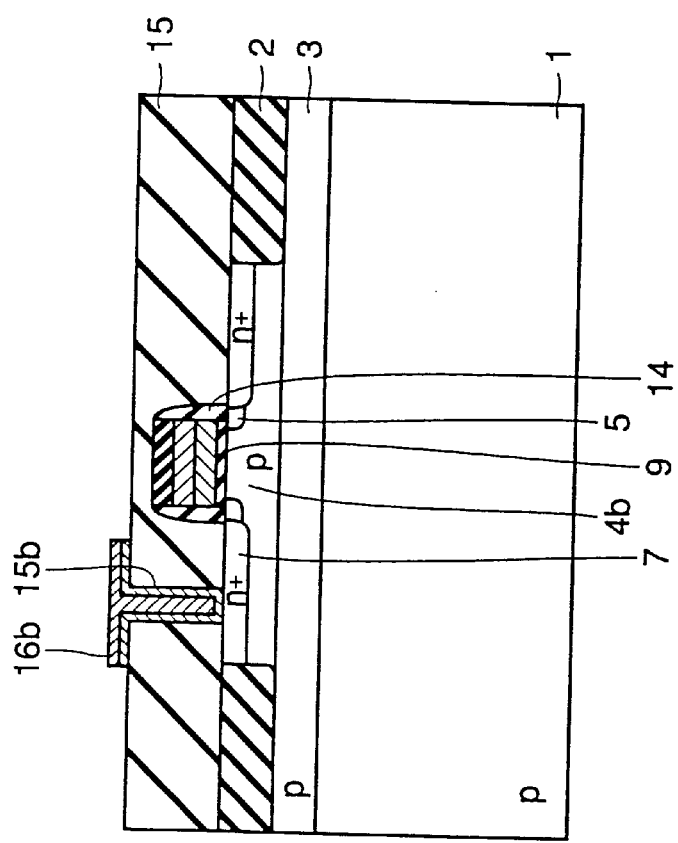
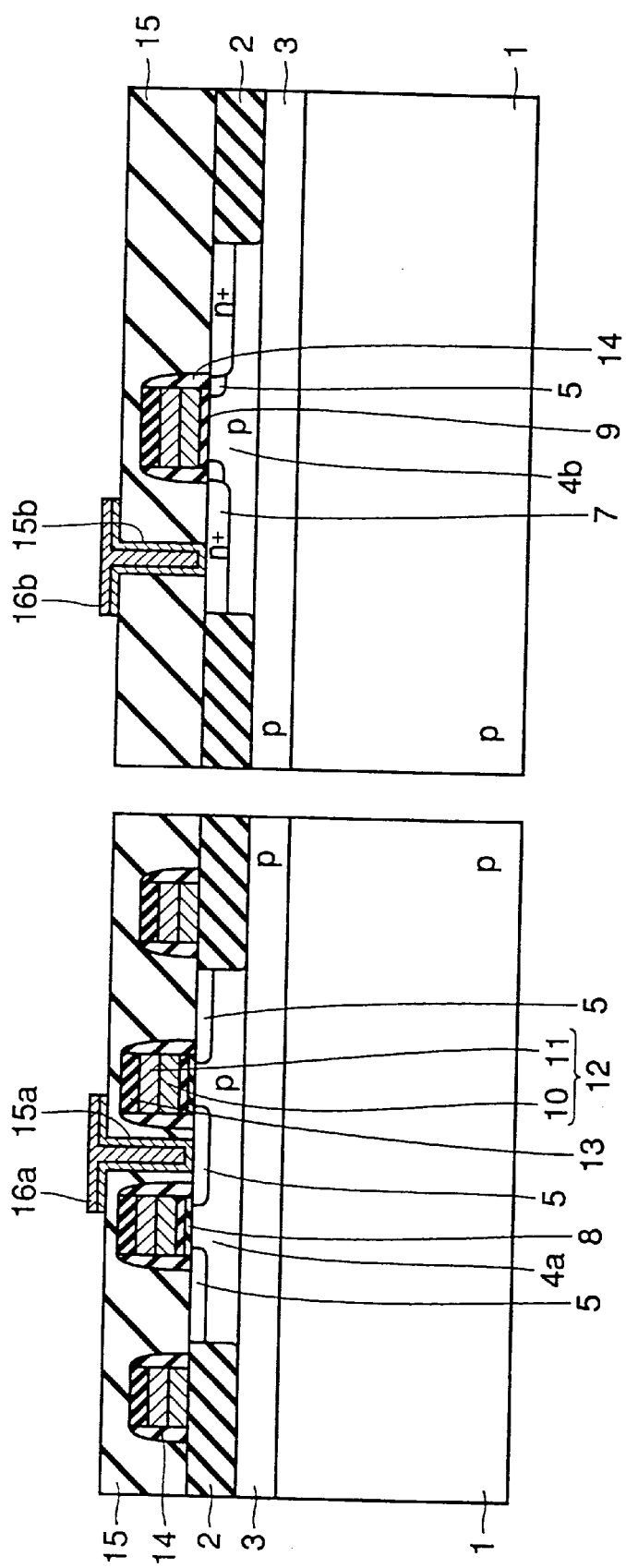

MEMORY CELL PORTION

PERIPHERAL CIRCUITRY

MEMORY CELL PORTION

PERIPHERAL CIRCUITRY

FIG. 20A
MEMORY CELL PORTION
FIG. 20B
PERIPHERAL CIRCUITRY
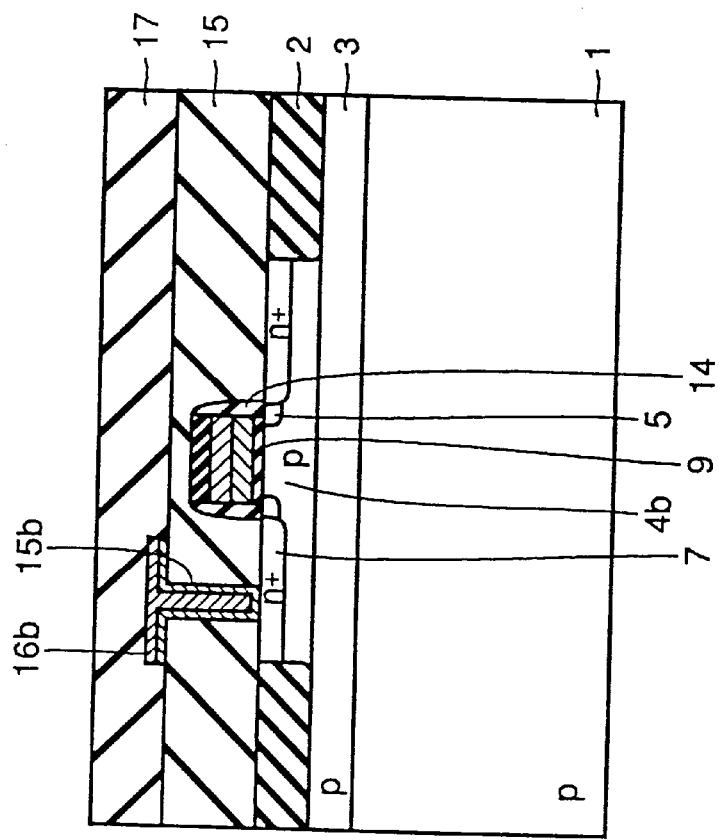
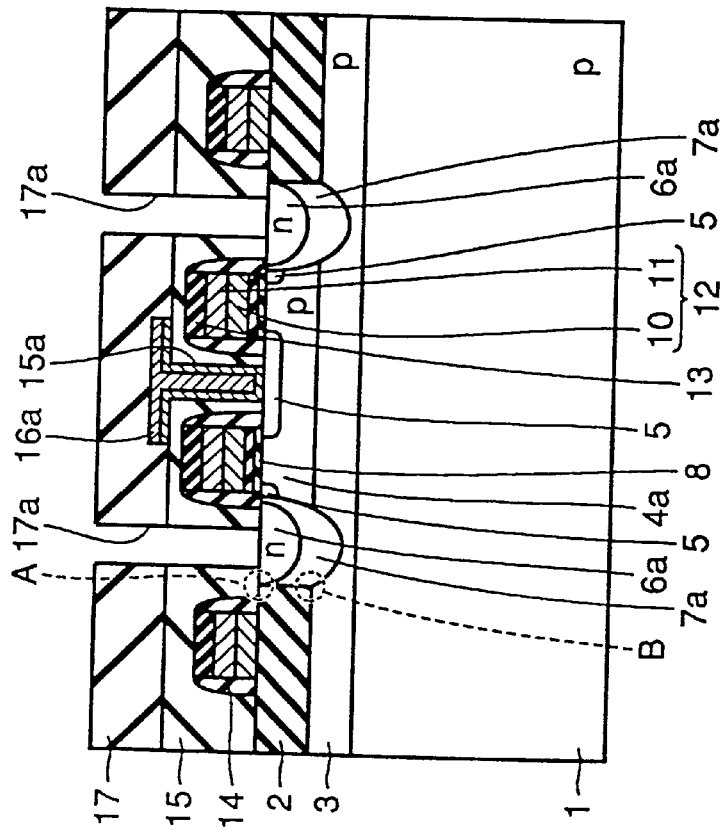

FIG. 21A
MEMORY CELL PORTION
FIG. 21B
PERIPHERAL CIRCUITRY
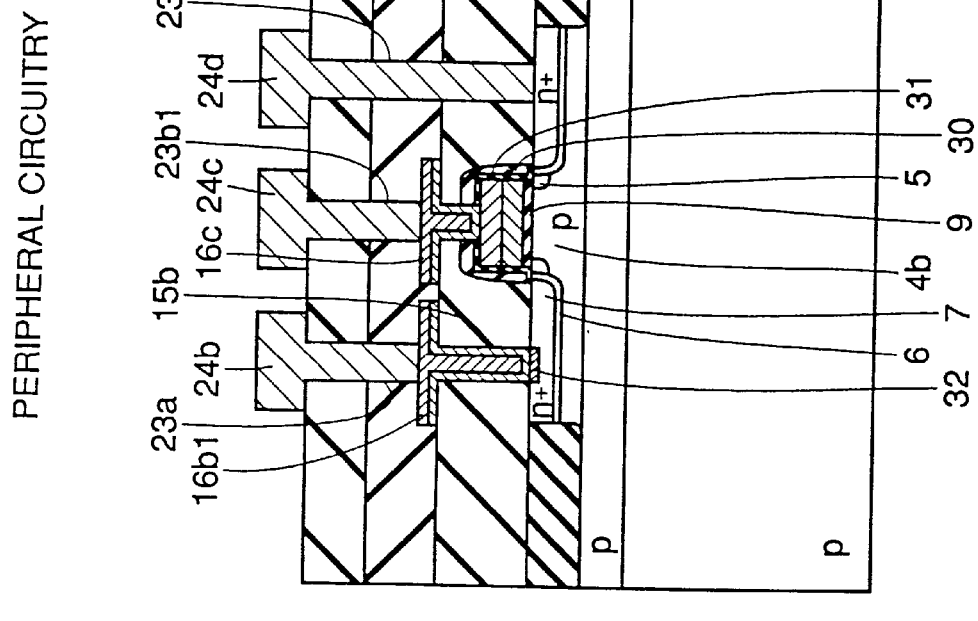
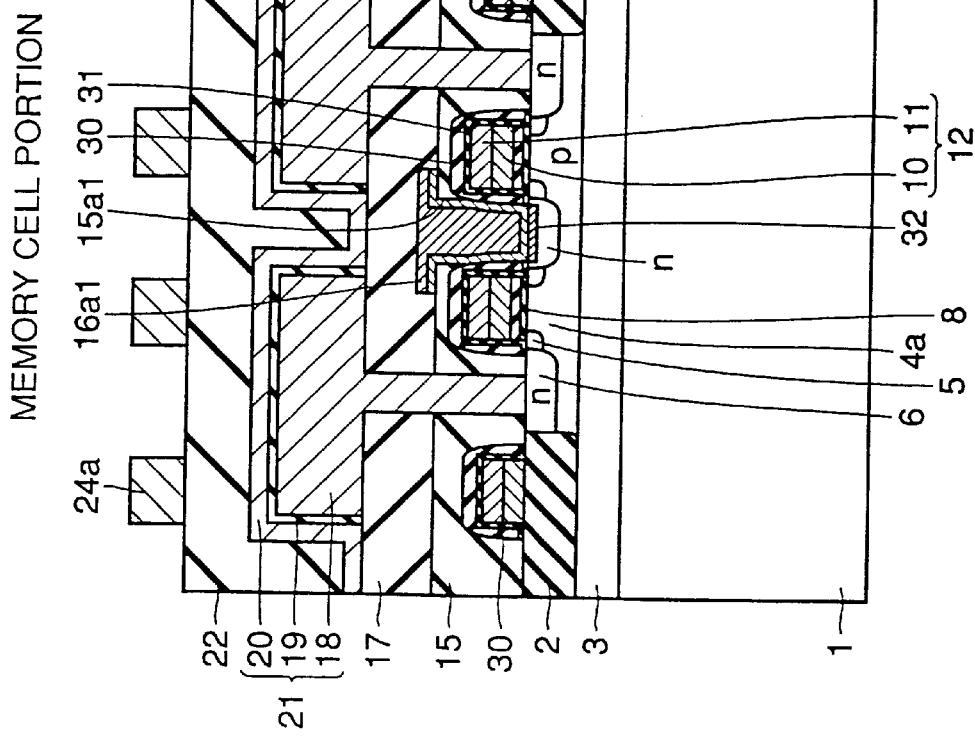

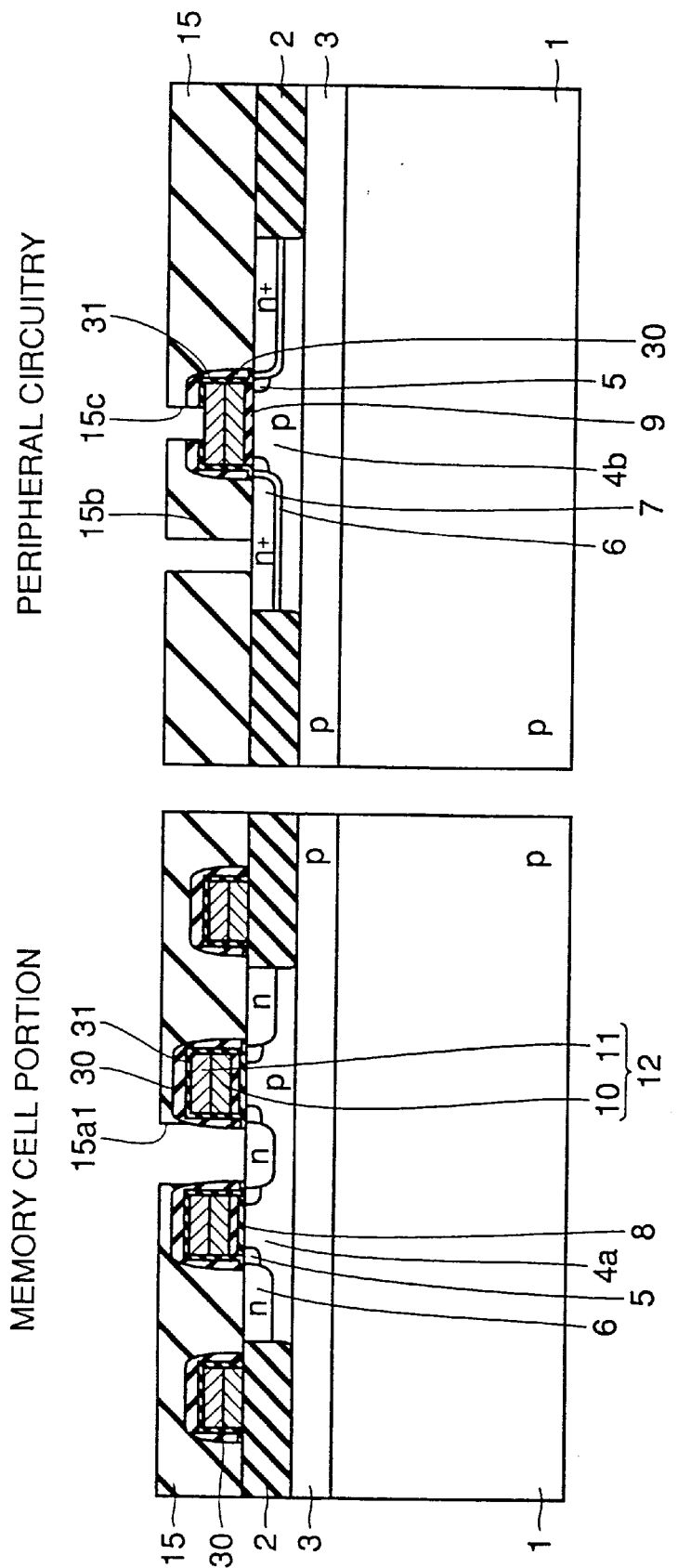

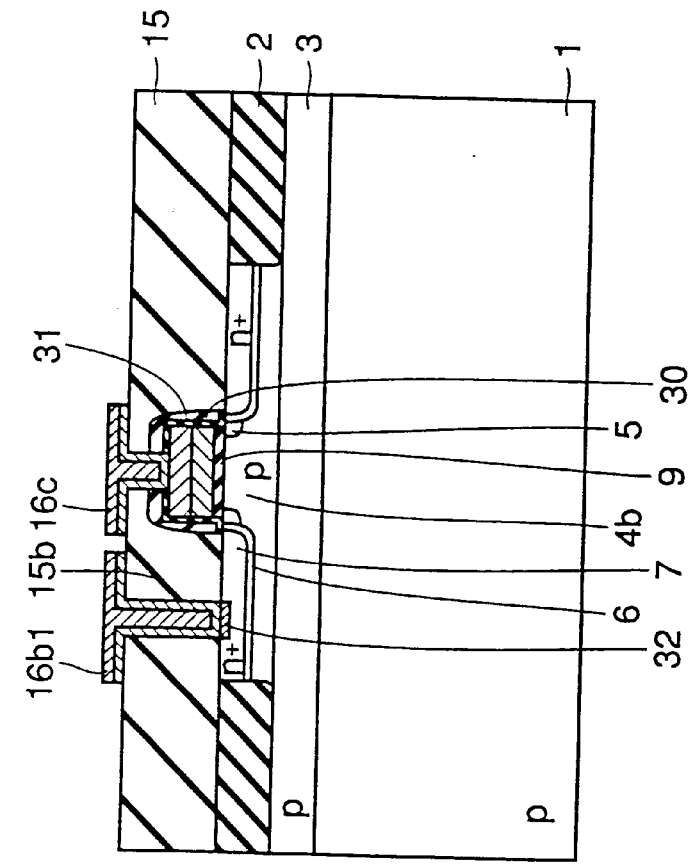
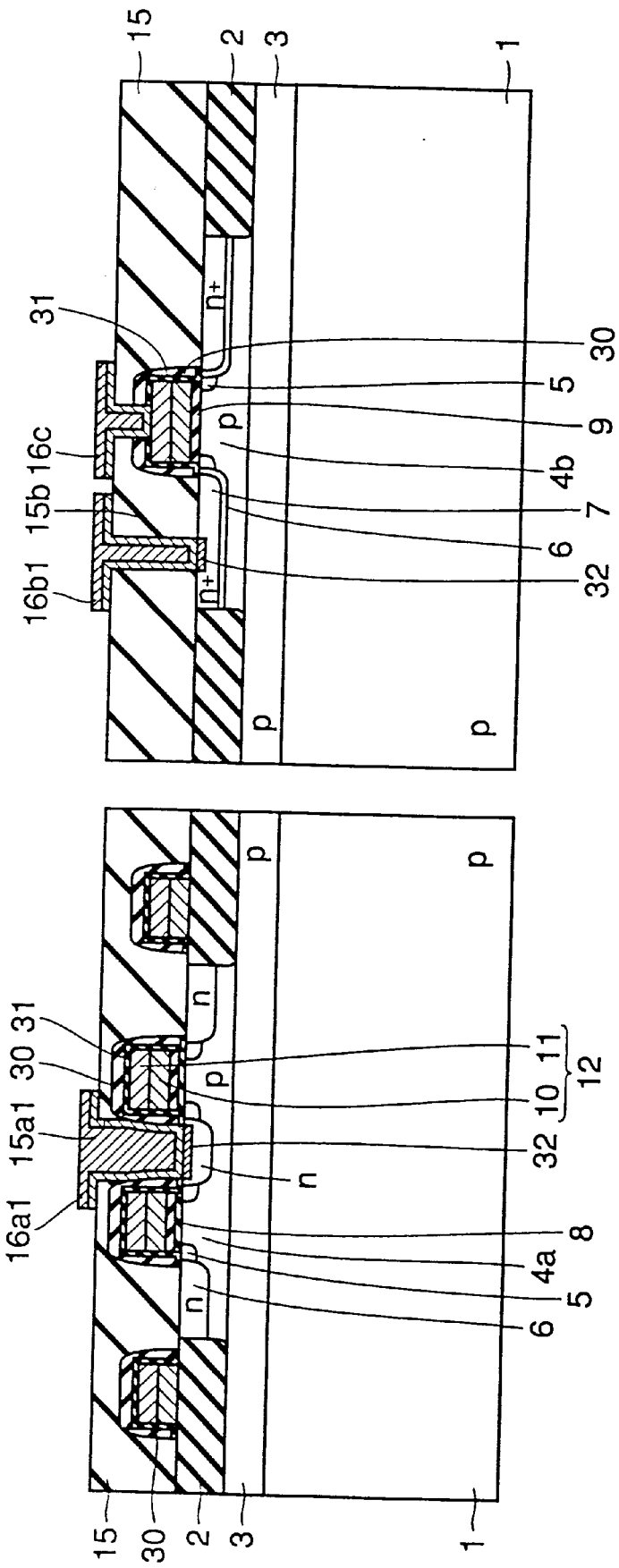

MEMORY CELL PORTION

PERIPHERAL CIRCUITRY

MEMORY CELL PORTION

PERIPHERAL CIRCUITRY

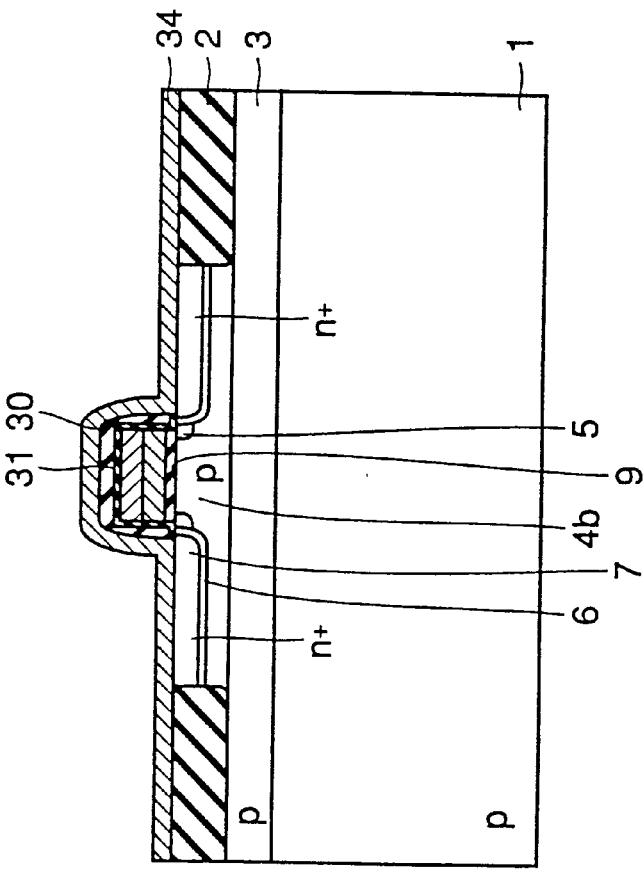
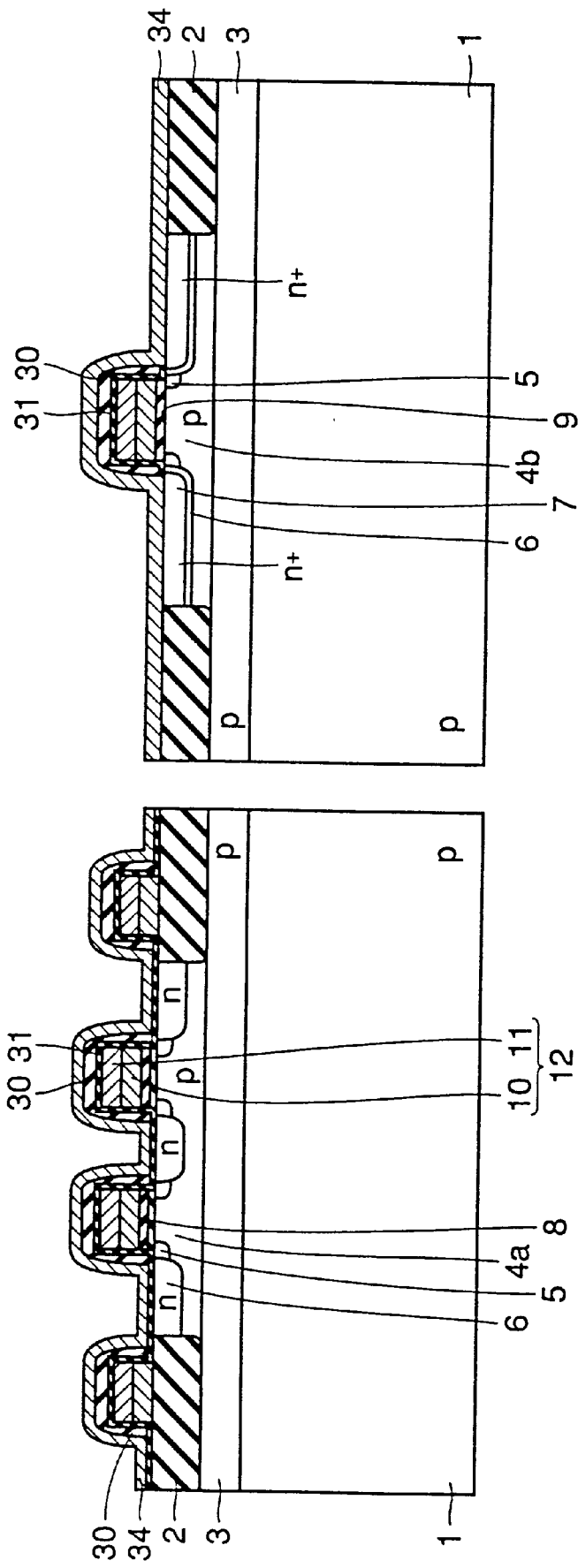

MEMORY CELL PORTION

PERIPHERAL CIRCUITRY

MEMORY CELL PORTION

PERIPHERAL CIRCUITRY

MEMORY CELL PORTION

PERIPHERAL CIRCUITRY

MEMORY CELL PORTION

PERIPHERAL CIRCUITRY

MEMORY CELL PORTION

PERIPHERAL CIRCUITRY

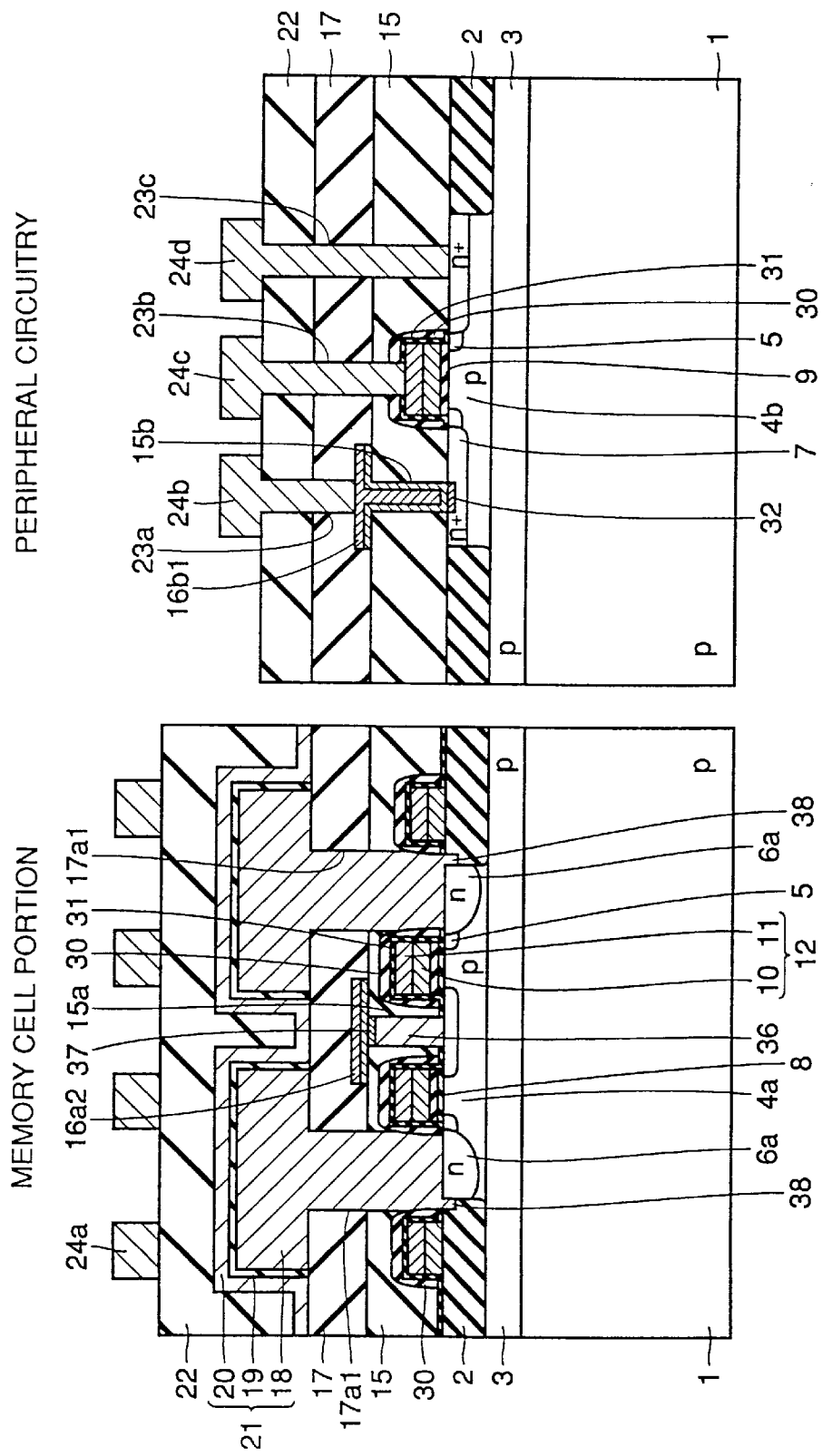
FIG. 36B PERIPHERAL CIRCUITRY
FIG. 36A MEMORY CELL PORTION

INTEGRATED CIRCUIT HAVING A MEMORY CELL TRANSISTOR WITH A GATE OXIDE LAYER WHICH IS THICKER THAN THE GATE OXIDE LAYER OF A PERIPHERAL CIRCUIT TRANSISTOR

BACKGROUND OF THE INVENTION

1. Field of the Invention

The present invention relates to a semiconductor device and a method of manufacturing the same, and particularly relates to a dynamic random access memory (which will be referred to as a "DRAM" hereinafter).

2. Description of the Background Art

In recent years, demands for semiconductor memory devices have been rapidly increased owing to rapid and wide spread of information equipments such as computers. Regarding a function, devices having a large-scale storage capacity and a high operation speed have been demanded. In view of this, technical development has been made for improving a density, a responsibility and a reliability of semiconductor memory devices.

The DRAM is a kind of semiconductor memory device allowing random input/output of storage information. The DRAM is generally formed of a memory cell array, which is a storage region storing large storage information, and a peripheral circuitry required for external input and output.

FIGS. 37A and 37B show a DRAM having conventional memory cells of a stacked type. Referring to FIGS. 37A and 37B, a p-type semiconductor substrate 1 is provided at its main surface with a p-type impurity region 3. A field insulating film 2 and p-type impurity regions 4a and 4b are formed on p-type impurity region 3. p-type impurity regions 4a and 4b are provided for controlling threshold voltages of transistors.

Lightly doped n-type impurity regions 5 which are spaced from each other are formed at the surface of p-type impurity region 4a. Lightly doped n-type impurity regions 5 and heavily doped n-type impurity regions 7 are formed at spaced portions of the surface of p-type impurity region 4b.

Gate electrodes 12 are formed on the main surface of semiconductor substrate 1 in the memory cell portion with gate insulating films 8b therebetween, respectively, and gate electrodes 12 are also formed on the main surface of semiconductor substrate 1 in the peripheral circuitry with gate insulating films 9 therebetween, respectively. Gate insulating films 8 and 9 are equal in thickness. Each gate electrode 12 is formed of a polycrystalline silicon film 10 and a WSi film 11.

A TEOS (Tetra Btyle Ortho Silicate) is formed on gate electrode 12, and a side wall insulating film 14 is formed on the side wall of gate electrode 12. Gate electrodes 12 are covered with an interlayer insulating film 15 extending through the memory cell portion and the peripheral circuitry. Contact holes 15a and 15b are formed in interlayer insulating film 15.

A bit line 16a having a portion located within contact hole 15a extends on interlayer insulating film 15, and an interconnection layer 16b having a portion located within contact hole 15b extends on interlayer insulating film 15. Bit line 16a and interconnection layer 16b are covered with an interlayer insulating film 17. Contact holes 17a which reach lightly doped n-type impurity regions 5, respectively, extend through interlayer insulating films 17 and 15.

Storage nodes 18 which have portions located within contact holes 17a, respectively, extend on interlayer insulating film 17. A surface of each storage node 18 is covered with a capacitor insulating film 19, over which a cell plate 20 is formed. Cell plate 20, capacitor insulating film 19 and storage node 18 form a capacitor 21.

Capacitors 21 and interlayer insulating film 17 are covered with an interlayer insulating film 22. The peripheral circuitry is provided with a contact hole 23a extending through interlayer insulating films 22 and 17, a contact hole 23b reaching corresponding gate electrode 12 and a contact hole 23c reaching heavily doped n-type impurity region 7. Metal interconnections 24b, 24c and 24d, which have portions located within contact holes 23a, 23b and 23c, respectively, extend on interlayer insulating film 22. In the memory cell portion, metal interconnections 24a are formed on interlayer insulating film 22.

In recent years, elements have been further miniaturized, and the thicknesses of gate insulating films 8b and 9 have been reduced. Particularly, a concentration of p-type impurity region 4a for controlling a threshold voltage of the transistor in the memory cell portion have been increased in accordance with the above reduction in thickness. Consequently, such a problem is becoming manifest that a leak current at a pn-junction (which will be merely referred to as a "junction leak current" hereinafter) increases.

According to the isolating structure of the trench type shown in FIGS. 37A and 37B, there is a tendency that a stress concentrates at the vicinity such as a region A and B of the periphery of field insulating film 2. In this case, the junction leak current cannot be suppressed sufficiently because the source/drain of the transistor in the memory cell portion are formed of only lightly doped n-type impurity region 5. Further, an etching damage is liable to occur at region A when side wall insulating film 14 is etched. This also becomes a cause of generation of the junction leak current. Such a junction leak current may destroy data stored in storage node 18.

Further, the foregoing increase in concentration of p-type impurity region 4a for the threshold voltage control causes disadvantageous increase in sheet resistance of lightly doped n-type impurity region 5.

SUMMARY OF THE INVENTION

The invention has been developed to overcome the above problems. An object of the invention is to reduce a junction leak current.

According to an aspect, a semiconductor device of the invention includes a first transistor having a gate insulating film of a first thickness, and a second transistor having a gate insulating film of a second thickness smaller than the first thickness. At least one of source/drain of the first transistor is formed of a first lightly doped region and a first heavily doped region. At least one of source/drain of the second transistor includes a second lightly doped region and a second heavily doped region higher in concentration than the first heavily doped region.

As described above, the gate insulating film of the first transistor is thicker than the gate insulating film of the second transistor so that it is possible to lower a concentration of an impurity region provided for controlling a threshold voltage of the first transistor. Thereby, it is possible to lower a junction leak current. Since at least one of source/drain of the first transistor has the first heavily doped region, the junction leak current can be lower than that in the prior art even if a field insulating film is adjacent to the source/drain. Further, provision of the forgoing first heavily doped region can reduce the sheet resistance of the source/drain.

Since the second transistor has the second heavily doped region of a higher concentration than the first heavily doped region, the sheet resistance of the source/drain can be sufficiently reduced.

At least one of the source/drain of the second transistor may have a medium-doped region having a concentration higher than the second lightly doped region and lower than the second heavily doped region.

By providing the medium-doped region as described above, it is possible to surround the second heavily doped region by the medium-doped region. Thereby, it is possible to avoid direct contact of the second heavily doped region with an impurity region of a different conductivity type so that concentration of an electric field can be suppressed. This also contributes to reduction in junction leak current.

Preferably, the semiconductor device includes a memory cell portion for storing data and a peripheral circuit portion for external input/output. In this case, it is preferable that the memory cell portion includes the first transistor, and the peripheral circuit portion includes the second transistor.

The above structure in which the memory cell includes the first transistor can reduce the junction leak current at the memory cell portion. In the peripheral circuitry, it is possible to provide the transistor having source/drain of a reduced sheet resistance and thus having a high performance.

A diffusion depth (a depth of the peak concentration) of the second heavily doped region is preferably smaller than a diffusion depth of the medium-doped region.

Thereby, it is possible to surround the second heavily doped region by the medium-doped region, and thereby the junction leak current can be reduced as described above.

A field insulating film may be formed in contact with the first heavily doped region. In this structure, the first and second transistors are covered with an interlayer insulating film having a contact hole reaching the first heavily doped region and the field insulating film, and a concavity is formed at the field insulating film located immediately under the contact hole. A storage node is formed in the concavity and on the first heavily doped region.

By formation of the field insulating film in contact with the heavily doped region, it is possible to reduce the junction leak current at the vicinity of the periphery of the field insulating film. Further, by formation of the concavity at the field insulating film located immediately under the contact hole, it is possible to remove the field insulating film from a portion where a stress is liable to concentrate. This also contributes to reduction in junction leak current. By provision of the concavity, it is possible to increase a contact area between the storage node and the heavily doped region. Thereby, a contact resistance can be improved.

According to another aspect, a semiconductor device of the invention includes a semiconductor substrate having a main surface, first and second impurity regions for threshold voltage control, and first and second transistors. The first impurity region has a peak concentration at a position of a first depth from the main surface. The second impurity region is spaced from the first impurity region, and has a peak concentration at a position of a second depth larger than the first depth. The first transistor is formed on the first impurity region, and has a gate insulating film of a first thickness. The second transistor is formed on the second impurity region, and has a gate insulating film of a second thickness smaller than the first thickness.

By employing the first transistor having the gate insulating film thicker than the gate insulating film of the second transistor, it is possible to reduce the concentration of the first impurity region. Further, by locating the peak concentration of the first impurity region at the position shallower than the peak concentration of the second impurity region, it is possible to reduce further the concentration of the first impurity region. Thereby, the junction leak current can be reduced further effectively.

A third impurity region lower in concentration than the first impurity region may be formed under the first impurity region. It is preferable that the first transistor has a pair of first source/drain, and at least one of the first source/drain reaches the third impurity region. It is preferable that the second transistor has a pair of second source/drain having diffusion depths smaller than the second depth.

Owing to the above structure in which at least one of the first source/drain reaches the position deeper than the first impurity region, it is possible to reduce a contact area of the first impurity region with respect to the source/drain. Thereby, the junction leak current can be further reduced.

According to still another aspect, a semiconductor device of the invention includes a first transistor having a gate insulating film of a first thickness, and a second transistor having a gate insulating film of a second thickness smaller than the first thickness. The first transistor has first and second impurity regions having relatively large first diffusion depth and relatively small second diffusion depth and forming source/drain, respectively. The second transistor has third and fourth diffusion regions having diffusion depths smaller than the first diffusion depth and not smaller than the second diffusion depth, and forming source/drain, respectively.

By employing the first transistor having the gate insulating film thicker than the gate insulating film of the second transistor as described above, the junction leak current can be reduced. Further, owing to the structure wherein only the first diffusion region has the large diffusion depth, deterioration in resistance against punch through can be suppressed in a subminiaturized structure, compared with a structure wherein both the first and second impurity regions have equal diffusion depths.

A concentration of the first impurity region having the first diffusion depth is preferably higher than a concentration of the second impurity region. In this structure, a field insulating film may be formed in contact with the first impurity region.

By deeply forming the first impurity region having the relatively high impurity concentration as described above, the periphery of the field insulating film can be covered with the first impurity region. Thereby, it is possible to reduce a junction leak current at the vicinity of the bottom of the field insulating film.

According to yet another aspect of the invention, a semiconductor device of the invention includes first and second transistors, an interlayer insulating film, a plug electrode, a bit line, and first and second metal silicide. The first transistor is formed on a main surface of a semiconductor substrate, and has first source/drain. The second transistor is formed on the main surface with a space from the first transistor, and has second source/drain. An interlayer insulating film covers the first and second transistors, and has a contact hole reaching one of the first source/drain. The plug electrode is formed in the contact hole. The first metal silicide is formed on surfaces of the second source/drain. The bit line is formed on the plug electrode with a second metal silicide therebetween.

Since a metal film for forming the metal silicide is usually formed by a sputtering method, it is difficult to form a thick metal silicide at the bottom of the contact hole. In contrast to this, the second metal silicide can be thick because the second metal silicide is formed on the plug electrode as described above. Meanwhile, it is possible to form thick metal silicide films on the surfaces of the second source/ drain of the second transistor by a known method, respectively. By forming the thick metal silicide as described above, a heat resistance can be improved. Thereby, it is possible to avoid disadvantages such as deterioration in junction leak current characteristic and increase in contact resistance, which may be caused by deterioration of the metal silicide due to a heat treatment at about 800° C. or more.

A method of manufacturing a semiconductor device of an aspect of the invention includes the following steps. First and second gate electrodes of first and second transistors are formed on a main surface of a semiconductor substrate with a space between each other. A nitride film covering the first and second gate electrodes is formed. Sources and drains of the first and second transistors are formed. An interlayer insulating film covering the nitride film is formed. A first contact hole reaching one of the source/drain of the first transistor is formed in the interlayer insulating film. A second contact hole reaching one of the source/drain of the second transistor and a third contact hole extending through the interlayer insulating film and the nitride film to the second gate electrode are formed in the interlayer insulating film. A bit line connected to one of the source/drain of the first transistor through the first contact hole as well as first and second interconnections extending in the second and third contact holes, respectively, are formed.

If elements are further miniaturized and the first contact hole connecting the bit line to the source/drain is formed in a self-aligned manner with respect to the gate electrode, it is preferable to form the first contact hole in a step other than that of forming the second and third contact holes. This is because of such a fact that the first contact hole is partially defined by the nitride film on a side wall of the first gate electrode during formation of the first contact hole in contrast to the third contact hole penetrating the nitride film. By forming the first contact hole in the step other than the step of forming the second and third contact holes, it is possible to provide the respective contact holes having desired sizes and forms. Further, the plug electrode can be formed only in the first contact hole. Owing to formation of this plug electrode, a thick metal silicide can be formed at the surface thereof so that deterioration in junction leak current characteristic can be effectively suppressed as described above.

The source/drain of the second transistor may have a heavily doped region, and the step of forming the source/ drain of the second transistor may include the step of forming first metal silicide at the surface of the heavily doped region. The step of forming the bit line may include the steps of forming the plug electrode in the first contact hole, forming second metal silicide at the surface of the plug electrode, and forming the bit line on the second metal silicide.

By forming the first metal silicide at the surface of the heavily doped region in the source/drain of the second transistor, it is possible to reduce a sheet resistance of the source/drain of the second transistor. Further, by forming the plug electrode in the first contact hole, it is possible to suppress deterioration in junction leak current characteristic as described above.

According to yet another aspect, a method of manufacturing a semiconductor device of the invention includes the following steps. First and second electrodes of first and second transistors are formed on a main surface of a semiconductor substrate with a space between each other. A nitride film covering side walls of the first and second gate electrodes is formed. First impurity regions are formed at opposite sides of the first and second gate electrodes. An interlayer insulating film covering the first and second gate electrodes is formed. A contact hole reaching one of the first impurity regions of the first transistor and the nitride film is formed in the interlayer insulating film. A second impurity region overlapping with the one of the first impurity regions of the first transistor and having a higher concentration than the first impurity region is formed by introducing impurity into the semiconductor substrate through the contact hole. A storage node electrically connected to the second impurity region through the contact hole is formed.

By forming the second impurity region as described above, it is possible to increase selectively a diffusion depth of one of the source/drain connected to the storage node. Thereby, a junction leak current can be effectively reduced in a structure wherein the field insulating film is formed in contact with the source/drain on the side provided with the second impurity region. Since the source/drain on the side not provided with the second impurity region can be shallow, deterioration in resistance against punch through can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B to 8A and 8B are cross sections showing distinctive 1st to 7th steps in a process of manufacturing the DRAM shown in FIGS. 1A and 1B;

FIGS. 14A and 14B are cross sections showing a DRAM of an embodiment 2 of the invention;

FIGS. 15A and 15B to 17A and 17B are cross sections showing distinctive 1st–3rd steps in a process of manufacturing the DRAM shown in FIGS. 14A and 14B;

FIGS. 20A and 20B are cross sections showing a distinctive step of manufacturing the DRAM of the embodiment 3;

FIGS. 21A and 21B are cross sections showing a DRAM of an embodiment 4 of the invention;

FIGS. 22A and 22B to 24A and 24B are cross sections showing distinctive 1st to 3rd steps in a process of manufacturing the DRAM shown in FIGS. 21A and 21B;

FIGS. 26A and 26B to 30A and 30B are cross sections showing distinctive 1st to 5th steps in a process of manufacturing the DRAM shown in FIGS. 25A and 25B;

FIGS. 36A and 36B are cross sections showing a modification of the DRAM shown in FIG. 35.

DESCRIPTION OF THE PREFERRED EMBODIMENTS

Embodiments of the invention will be described below with reference to FIGS. 1 to 36.

Embodiment 1

Figure 1A:
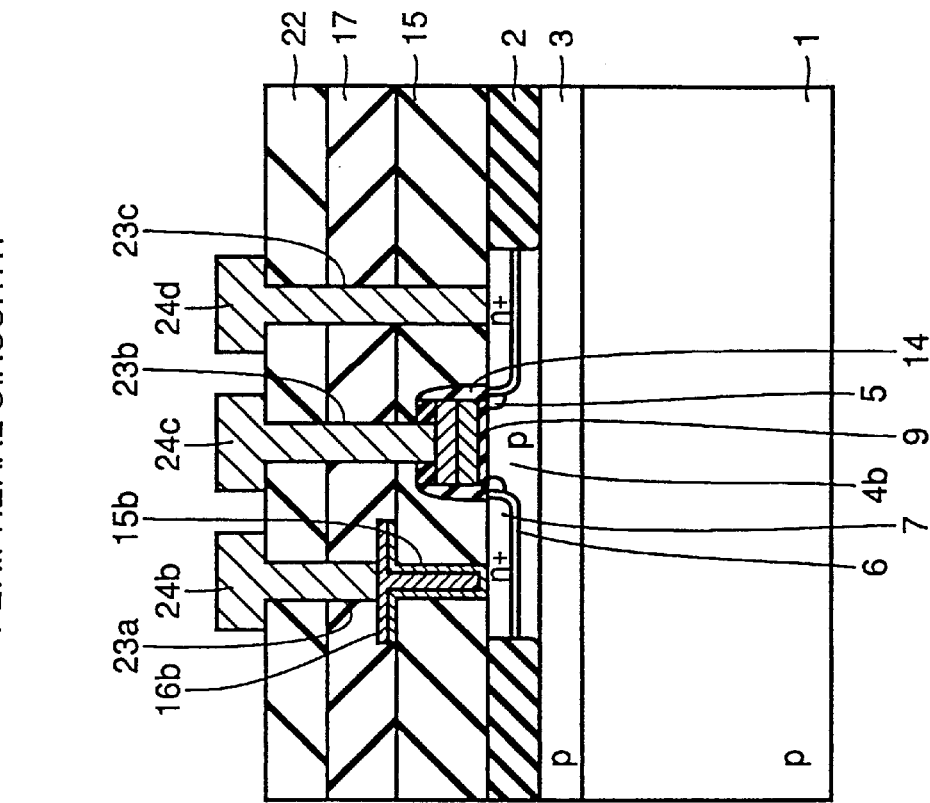
FIGS. 1A and 1B are cross sections showing a DRAM of an embodiment 1 of the invention.
Figure 1B:
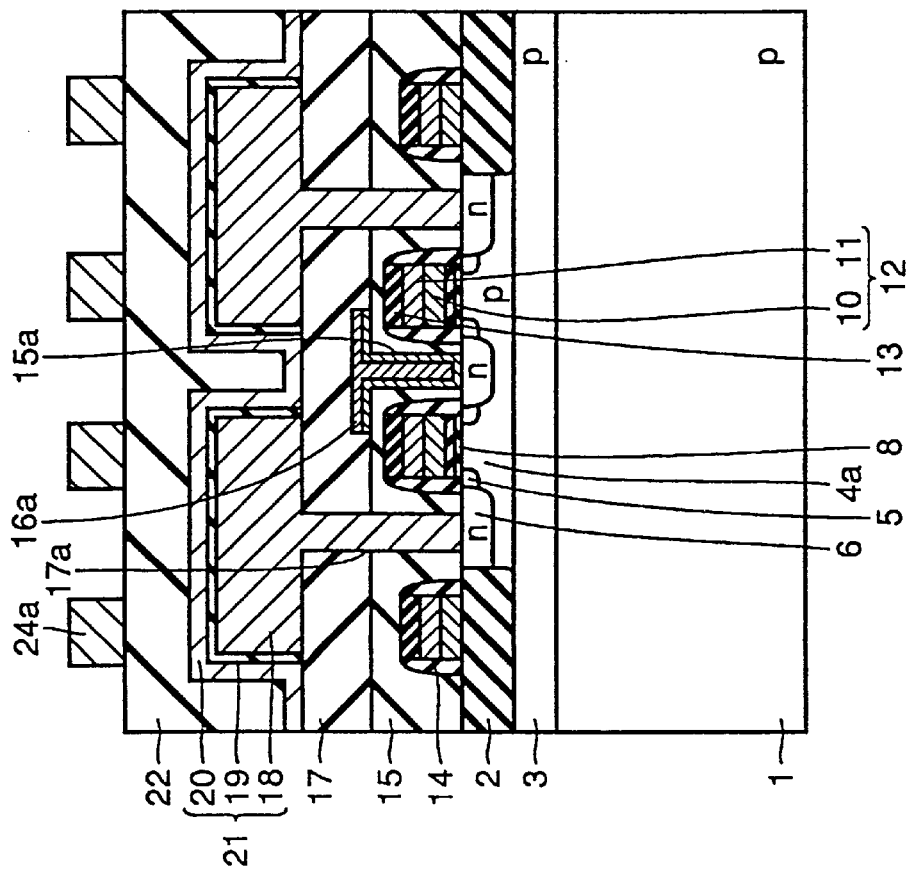

Referring first to FIGS. 1A and 1B to FIG. 13, an embodiment 1 of the invention and its modification will now be described below. FIGS. 1A and 1B are cross sections showing a DRAM of the embodiment 1 of the invention.

Referring to FIGS. 1A and 1B, a p-type semiconductor substrate 1 is provided at its main surface with a trench, in which a field insulating film 2 is formed. A p-type impurity region 3 for increasing an isolating performance is formed under field insulating film 2. p-type impurity regions 4a and 4b are formed on p-type impurity region 3 for controlling threshold voltages of transistors. p-type impurity region 4a located in the memory cell portion has an impurity concentration of about $10^{17}$ atoms/cm$^3$, and p-type impurity region 4b located in the peripheral circuitry has an impurity concentration of about $10^{18}$ atoms/cm Source and drain, each of which is formed of a lightly doped n-type impurity region 5 and a medium-doped n-type impurity region 6, are formed at the surface of p-type impurity region 4a. Lightly doped n-type impurity region 5 has a concentration from about $10^{16}$ to about $10^{19}$ atoms/cm$^3$, and medium-doped n-type impurity region 6 has a concentration from about $10^{17}$ to about $10^{20}$ atoms/cm$^3$. More preferably, the concentration of medium-doped n-type impurity region 6 is three to ten times larger than the concentration of lightly doped n-type impurity region 5.

In the peripheral circuitry, p-type impurity region 4b is provided at its surface with source/drain, each of which is formed of three regions having different impurity concentrations. More specifically, each of the source/drain is formed of lightly doped n-type impurity region 5, medium-doped n-type impurity region 6 and heavily doped n-type impurity region 7. Heavily doped n-type impurity region 7 has a concentration from about $10^{20}$ to about $10^{21}$ atoms/cm$^3$.

In the memory cell portion, a gate electrode 12 is formed on the main surface of p-type semiconductor substrate 1 located between the source/drain with a gate insulating film 8 therebetween. In the peripheral circuitry, a gate electrode 12 is formed on the main surface of p-type semiconductor substrate 1 located between the source/drain with a gate insulating film 9 therebetween. Gate insulating film 8 has a thickness of, e.g., about 10 nm, and gate insulating film 9 has a thickness of, e.g., about 5 nm. Owing to this structure in which gate insulating film 8 in the memory cell portion is thicker than gate insulating film 9 in the peripheral circuitry, it is possible to lower the concentration of p-type impurity region 4a in the memory cell portion. This is because increase in thickness of gate insulating film 8 can increase the threshold voltage of the MOS transistor. By reducing the concentration of p-type impurity region 4, it is possible to reduce the junction leak current.

By reducing the concentration of p-type impurity region 4a, a junction leak can be reduced even if medium-doped n-type impurity region 6 is formed. Owing to formation of medium-doped n-type impurity region 6, it is possible to reduce the leak current at the vicinity of the contact portions between medium-doped n-type impurity region 6 and field insulating film 2. In addition to this, it is also possible to reduce a sheet resistance of the source/drain in the memory cell portion. Thereby, the MOS transistors having a high performance and a high reliability are formed in the memory cell portion.

In the peripheral circuitry, the source/drain of MOS transistor have heavily doped n-type impurity regions 7 so that the sheet resistance of source/drain can be reduced even if p-type impurity region 4b for threshold voltage control has a high concentration. Therefore, deterioration in performance of the MOS transistor can be suppressed. As shown in FIGS. 1A and 1B, heavily doped n-type impurity region 7 has a diffusion depth smaller than that of medium-doped n-type impurity region 6. Thereby, it is possible to form medium-doped n-type impurity region 6 surrounding heavily doped n-type impurity region 7. As a result, concentration of an electric field can be suppressed, and a junction leak current at the peripheral circuitry can be reduced.

A TEOS oxide film 13 is formed on the top of each gate electrode 12, and side wall insulating film 14 is formed on the side wall of gate electrode 12. Gate electrodes 12 are covered with interlayer insulating film 15. Contact holes 15a and 15b are formed at interlayer insulating film 15. A bit line 16a is present in contact hole 15a, and an interconnection layer 16b is present in contact hole 15b. Each of bit line 16a and interconnection layer 16b has a layered structure formed of, e.g., WSi and polycrystalline silicon.

Bit line 16a and interconnection layer 16b are covered with an interlayer insulating film 17. A contact hole 17a extends through interlayer insulating films 17 and 15, and reaches medium-doped n-type impurity region 6. A storage node 18 having a portion located in contact hole 17a extends on interlayer insulating film 17. Storage node 18 is covered with a capacitor insulating film 19, over which a cell plate 20 is formed. Cell plate 20, capacitor insulating film 19 and storage node 18 form a capacitor 21.

An interlayer insulating film 22 covering capacitors 21 is formed on interlayer insulating film 17. A metal interconnection 24a is formed on interlayer insulating film 22 located in the memory cell portion. The peripheral circuitry is provided with a contact hole 23a extending through interlayer insulating films 22 and 17, a contact hole 23b reaching gate electrode 12 and a contact hole 23c reaching heavily doped n-type impurity region 7. Metal interconnections 24b–24d which have portions located in contact holes 23a–23c, respectively, extend on interlayer insulating film 22.

Referring to FIGS. 2A and 2B to 8A and 8B, description will be given on a method of manufacturing the DRAM shown in FIGS. 1A and 1B. FIGS. 2A and 2B to 8A and 8B are cross sections showing distinctive 1st to 7th steps in a process of manufacturing the DRAM shown in FIGS. 1A and 1B.

Figure 2A:
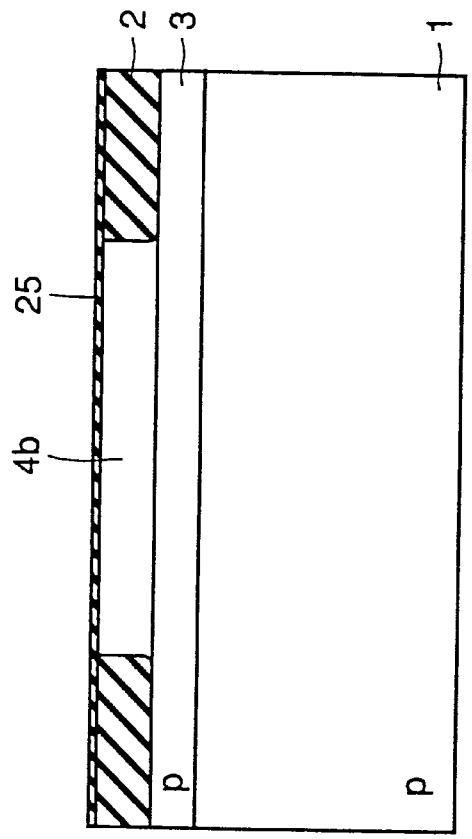
Figure 2B:
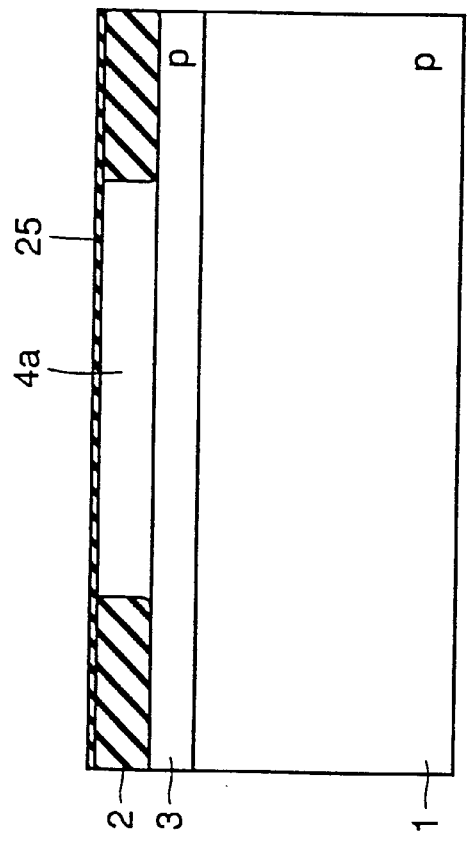

Referring to FIGS. 2A and 2B, the trench is formed at the main surface of p-type semiconductor substrate 1, and field insulating film 2 is formed by filling the trench with an insulating film such as a silicon oxide film. Then, p-type impurity regions 3, 4a and 4b are formed by an ion implanting method or the like. Then, a silicon oxide film 25 is formed over the entire surface by a thermal oxidizing method or the like. Silicon oxide film 25 has a thickness from about 7 to about 8 nm.

Figure 3A:
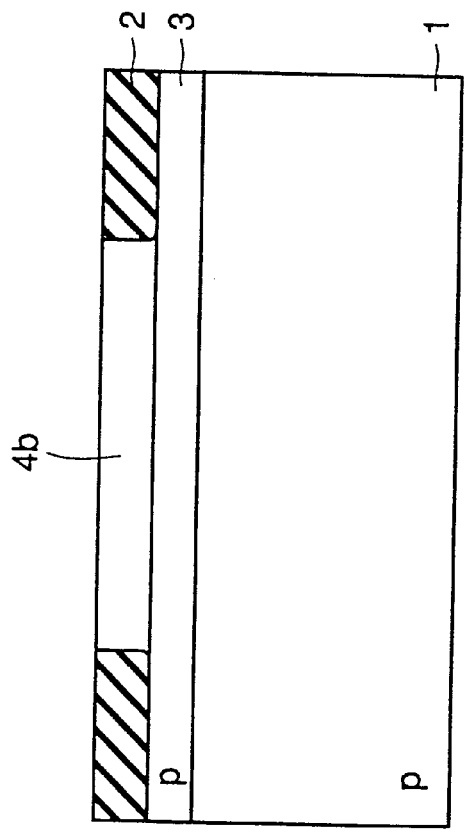
Figure 3B:
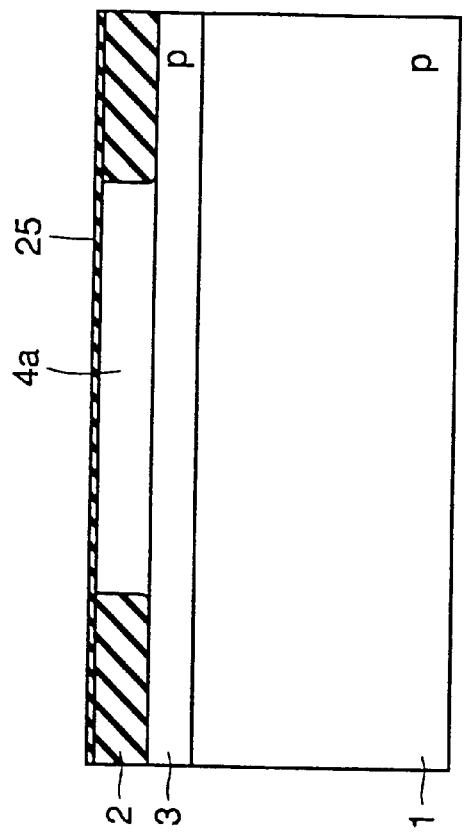
Figure 4A:
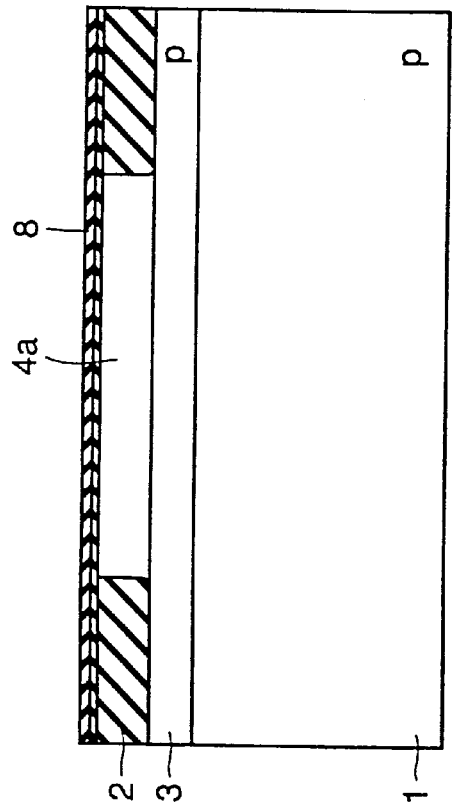
Figure 4B:
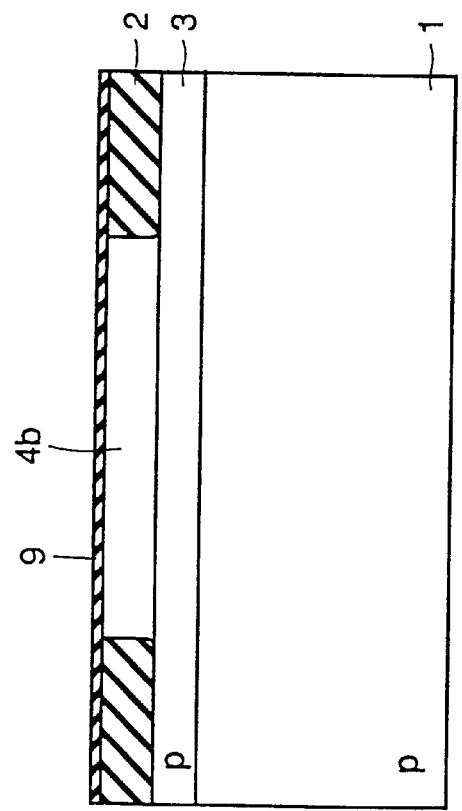

As shown in FIGS. 3A and 3B, silicon oxide film 25 is selectively etched to remove silicon oxide film 25 formed in the peripheral circuitry. Then, a thermal oxidizing method or the like is performed again to form a silicon oxide film of about 5 nm in thickness. Thereby, as shown in FIGS. 4A and 4B, gate insulating film 8 of about 10 nm in thickness is formed in the memory cell portion, and gate insulating film 9 of about 5 nm in thickness is formed in the peripheral circuitry.

Figure 5A:
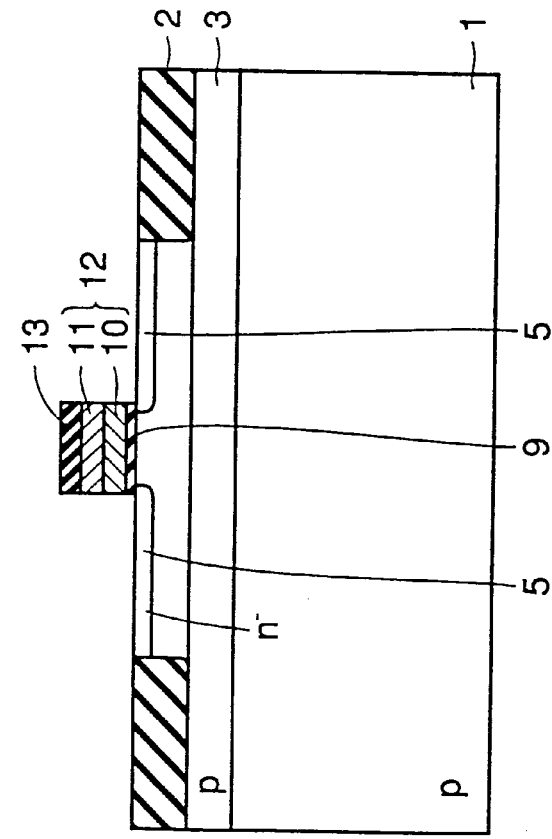
Figure 5B:
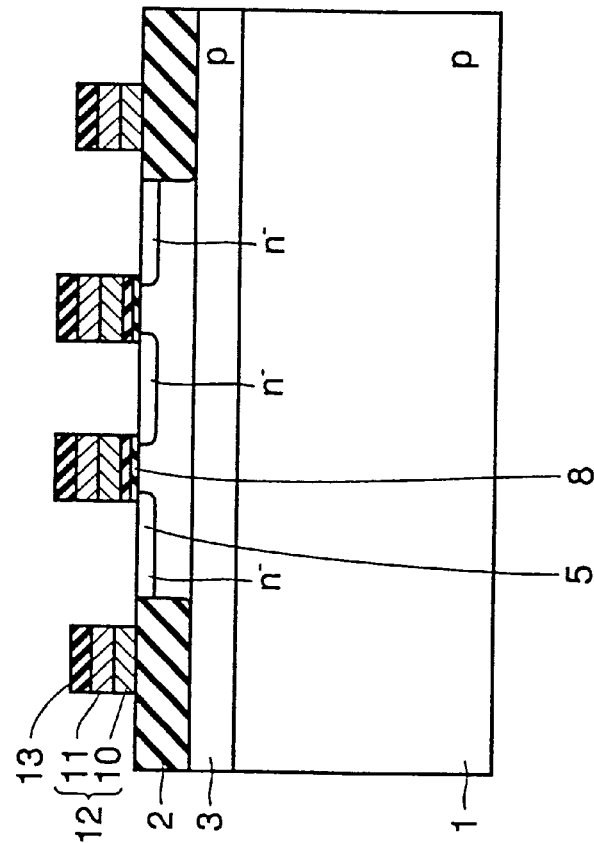

Referring to FIGS. 5A and 5B, polycrystalline silicon film 10, WSi film 11 and TEOS oxide film 13 are successively deposited, and then are patterned. Thereby, gate electrodes 12 are formed. Thereafter, ions of, e.g., phosphorus are implanted into semiconductor substrate 1 with a dose of $5 \times 10^{12}$–$5 \times 10^{13}$ atoms/cm$^2$ and 5–50 keV. Thereby, lightly doped n-type impurity regions 5 are formed in the memory cell portion and the peripheral circuitry.

Figure 6A:
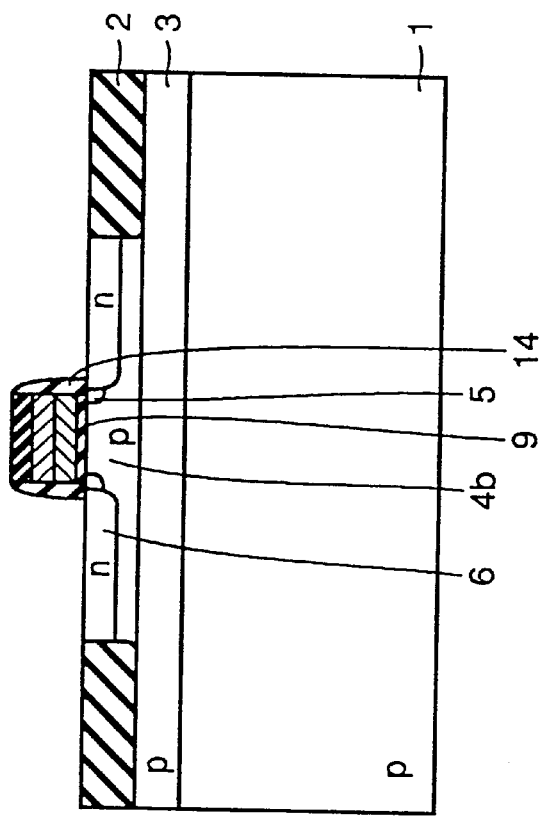
Figure 6B:
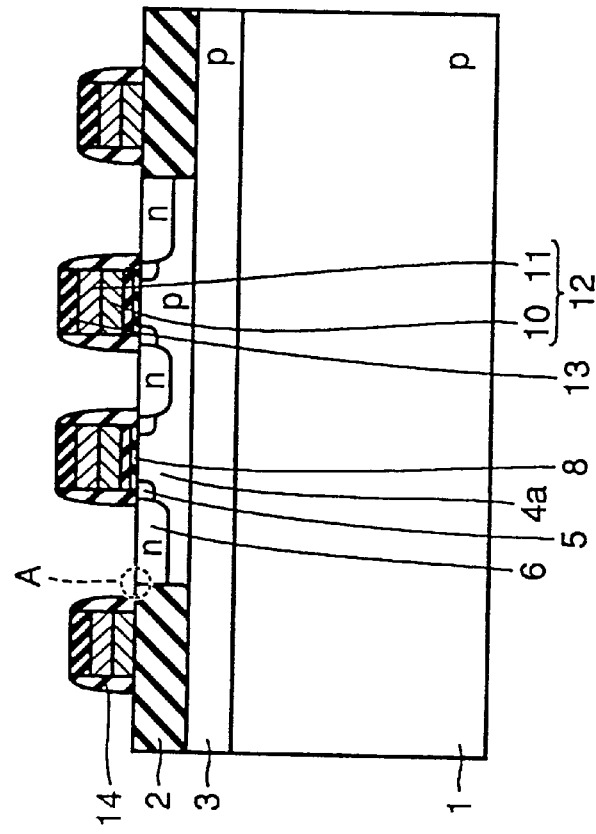

Referring to FIGS. 6A and 6B, side wall insulating films 14 are formed on the side walls of gate electrodes 12 and, thereafter, ions of, e.g., phosphorus are implanted into semiconductor substrate 1 with a dose of $3 \times 10^{13}$–$5 \times 10^{14}$ atoms/cm$^2$ and 10–100 keV. Thereby, medium-doped n-type impurity regions 6 are formed in the memory cell portion and the peripheral circuitry. Thereby, it becomes possible to reduce the leak current at region A near the periphery of field insulating film 2, which may be caused by a stress and/or a damage due to etching of side wall insulating films 14, and cannot be sufficiently reduced only by the lightly doped n-type impurity region 5 in the prior art.

Figure 7A:
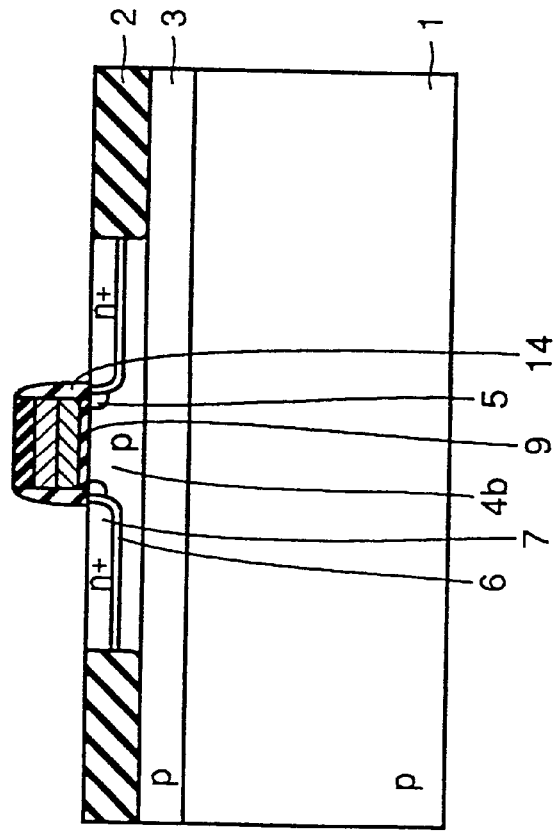
Figure 7B:
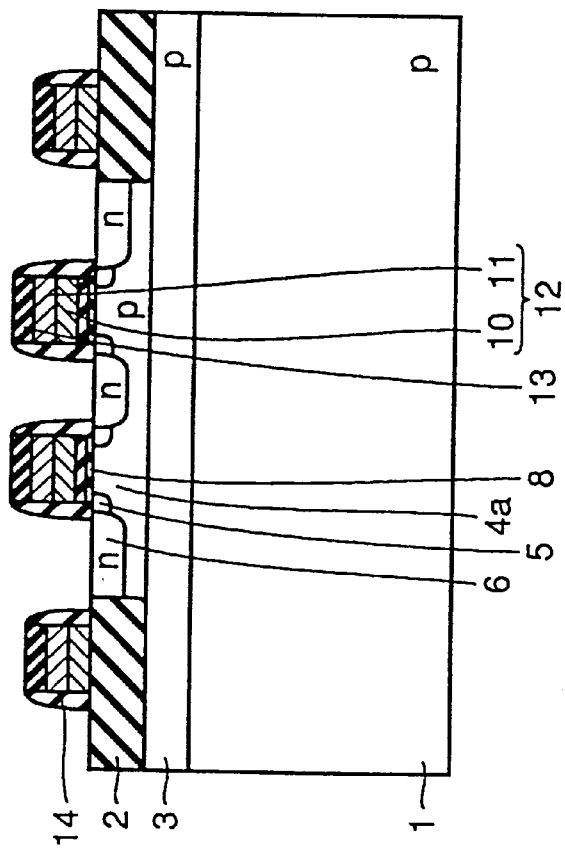

Referring to FIGS. 7A and 7B, a pair of heavily doped n-type impurity regions 7 are formed only in the peripheral circuitry. In this processing, the dose and implanting energy of n-type impurity are controlled so that the diffusion depth of heavily doped n-type impurity region 7 may be smaller than that of medium-doped n-type impurity region 6. Thereby, heavily doped n-type impurity region 7 surrounded by medium-doped n-type impurity region 6 is formed as shown in FIGS. 7A and 7B.

Referring to FIGS. 8A and 8B, an interlayer insulating film 15 is formed on the whole main surface of semiconductor substrate 1, and contact holes 15a and 15b are formed in interlayer insulating film 15. Thereafter, bit line 16a and interconnection layer 16b are formed.

Then, interlayer insulating film 17 covering bit line 16a and interconnection layer 16b is formed, and contact holes 17a are formed in the memory cell portion. After successively forming storage nodes 18, capacitor insulating films 19 and cell plates 20, interlayer insulating film 22 is formed. In the peripheral circuitry, contact holes 23a–23c are then formed, and metal interconnections 24a–24d are formed. Through the steps described above, the DRAM shown in FIGS. 1A and 1B is completed.

Figure 9A:
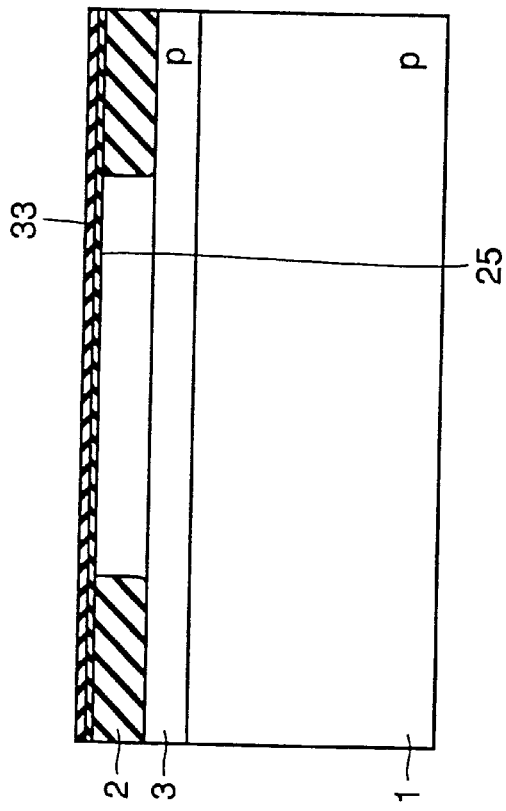
FIGS. 9A, 9B, 10A and 10B are cross sections showing distinctive 1st and 2nd steps in a modification of the embodiment 1.
Figure 9B:
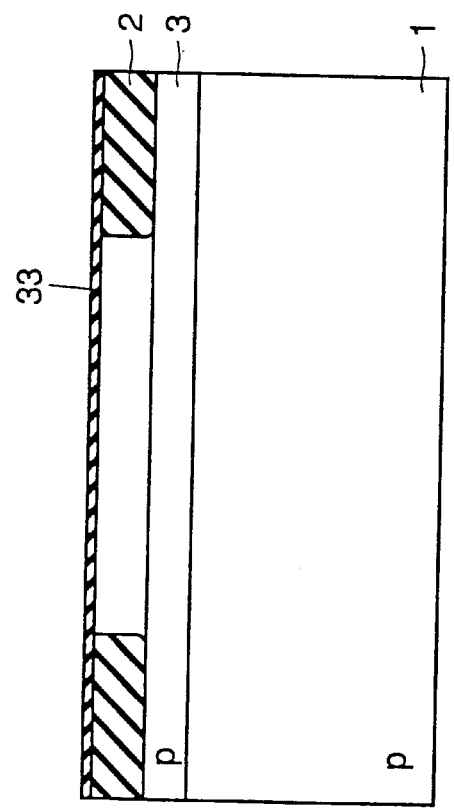

Referring to FIGS. 9A and 9B to 13, a modification of the embodiment 1 will be described below. Referring first to FIGS. 9A and 9B as well as FIGS. 10A and 10B, description will be given on a modification of a method of manufacturing gate insulating films 8 and 9. In the foregoing embodiment 1, gate insulating films 8 and 9 having different thicknesses are formed by performing twice the processing of forming the silicon oxide film. As shown in FIGS. 9A and 9B, however, an oxynitride film 33 may be formed after patterning silicon oxide film 25. Oxynitride film 33 can be formed by performing film deposition with a gas containing nitrogen.

Figure 10B:
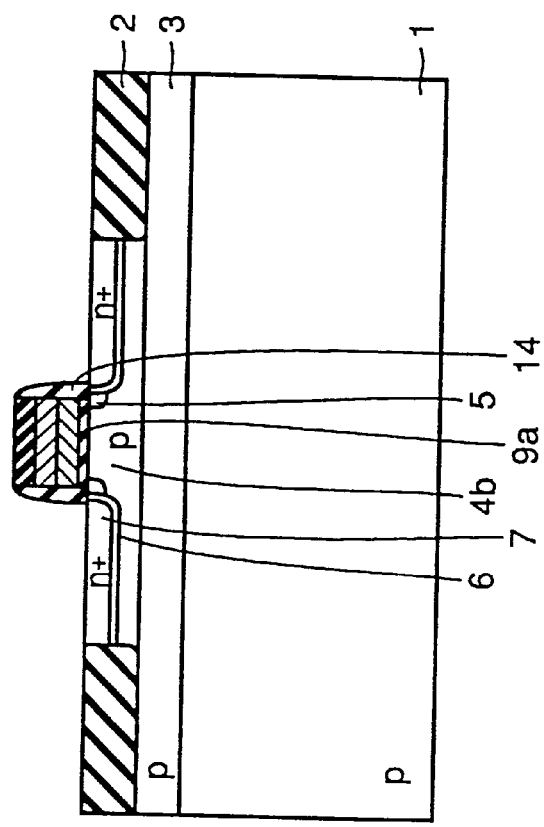
Figure 10A:
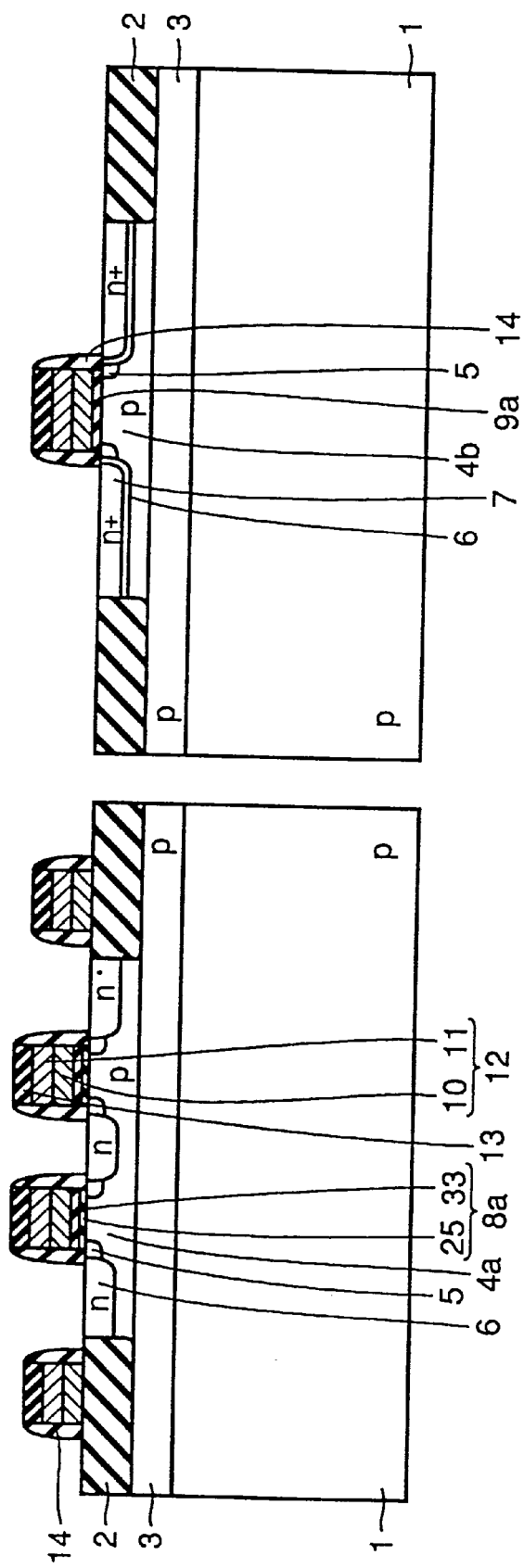

Thereafter, steps similar to those of the embodiment 1 are performed so that the MOS transistors having gate insulating films 8a and the MOS transistors having gate insulating films 9a are formed in the memory cell portion and the peripheral circuitry, respectively, as shown in FIGS. 10A and 10B. By employing the oxynitride film as the gate insulating film, it is possible to provide gate insulating films 8a and 9a having a high reliability.

Figure 11A:
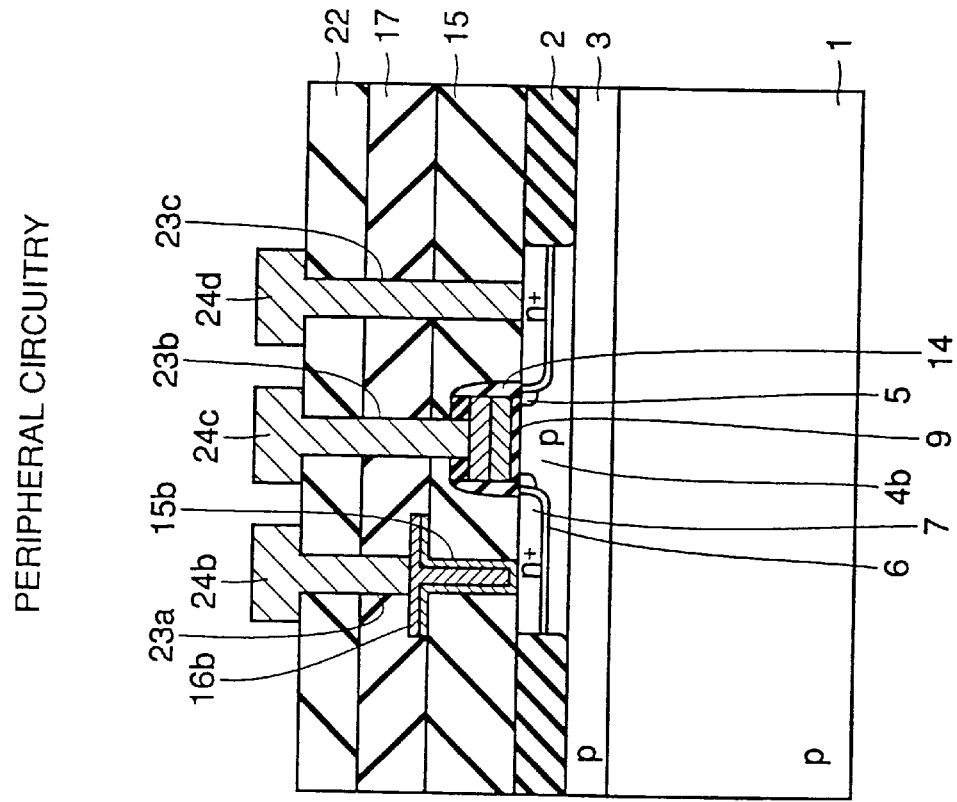
FIGS. 11A and 11B are cross sections showing another modification of the embodiment 1.
Figure 11B:
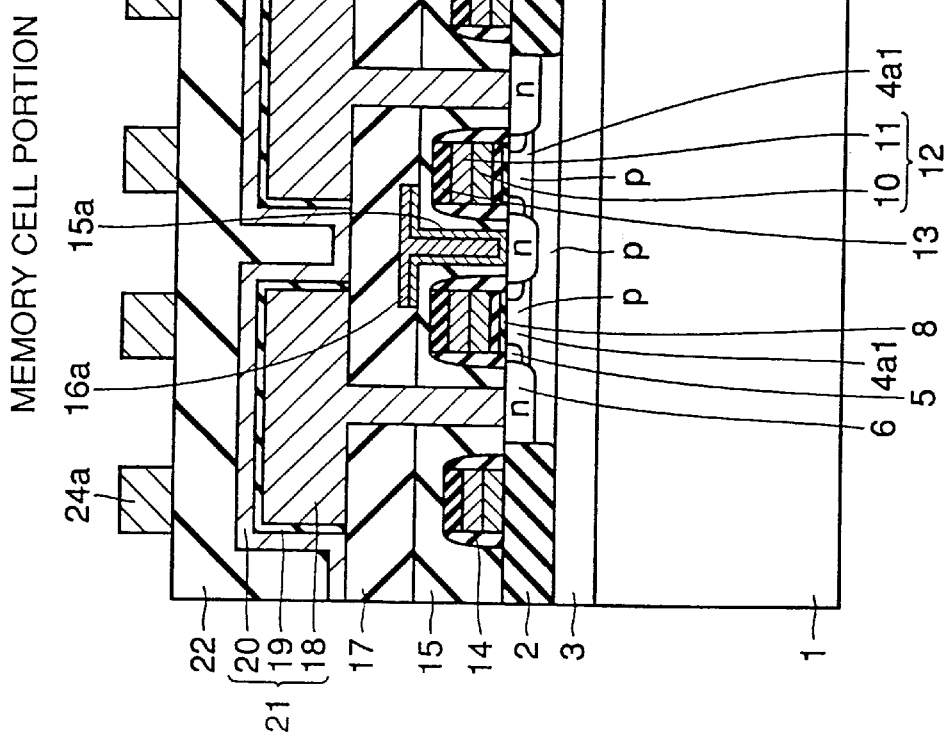

Referring to FIGS. 11A and 11B, another modification will be described below. In this modification, as shown in FIGS. 11A and 11B, a p-type impurity region 4a1 for threshold voltage control has a diffusion depth smaller than the diffusion depth of p-type impurity region 4b in the peripheral circuitry. This allows further reduction in peak concentration of p-type impurity region 4a1. As a result, the junction leak current can be further reduced. Since the concentration of p-type impurity region 4a1 can be reduced, the sheet resistance of lightly doped n-type impurity region 5 can be reduced.

Further, the structure, in which p-type impurity region 4a1 has the diffusion depth smaller than the diffusion depth of medium-doped n-type impurity region 6, results in such a structure that medium-doped n-type impurity region 6 extends into the lightly doped p-type impurity region located under p-type impurity region 4a1. Thereby, the junction leak current can be further reduced.

The impurity for threshold voltage control may be implanted after forming gate insulating films 8 and 9 or after forming gate electrode 12. In the peripheral circuitry, the gate insulating film may have a different thickness. By providing the gate insulating film having a different thickness in the peripheral circuitry, it is possible to form the MOS transistors having different threshold voltages with a constant channel implantation dose.

The embodiment 1 has been described in connection with the case where n-channel MOS transistors are formed in the peripheral circuitry. p-channel MOS transistors can be formed in the peripheral circuitry as follows.

Figure 12:
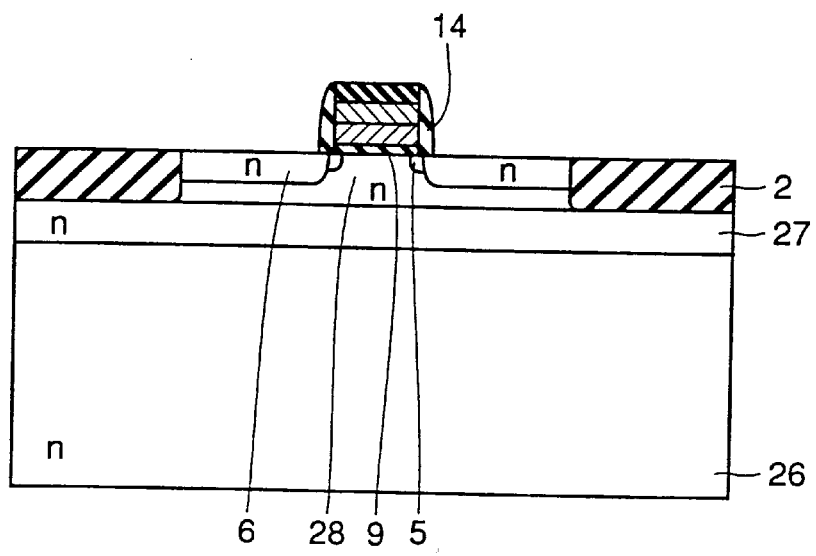
FIGS. 12 and 13 are cross sections showing 1st and 2nd steps in a process of manufacturing a p-channel MOS transistor in a peripheral circuitry, respectively.

Referring to FIG. 12, n-type impurity regions 27 and 28 are formed at the surface of an n-well region 26. Lightly doped n-type impurity region 5 and medium-doped n-type impurity region 6 are formed at the surface of n-type impurity region 28 by a manner similar to that of the foregoing embodiment 1.

Figure 13:
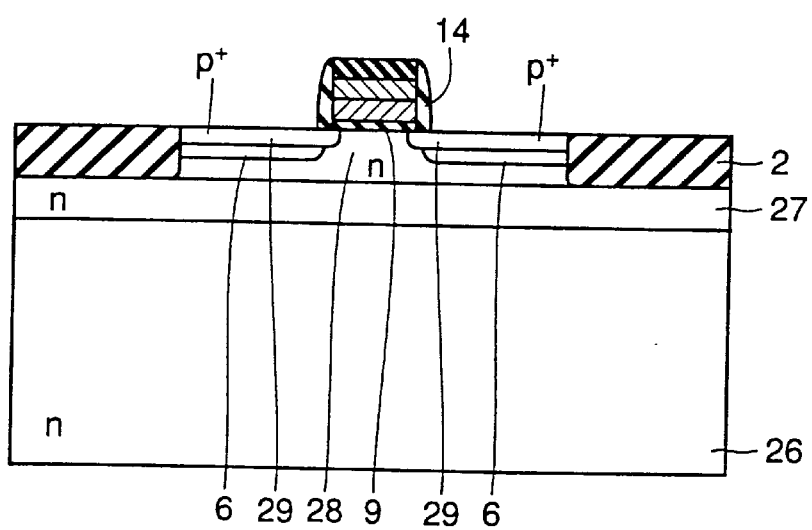

Referring to FIG. 13, p-type impurity is implanted into semiconductor substrate 1 to form a pair of heavily doped p-type impurity regions 29 forming source/drain.

In this manner, the p-channel MOS transistor is formed, whereby it is not necessary to form a mask covering a region for forming the p-channel MOS transistor when forming lightly doped n-type impurity region 5 and medium-doped n-type impurity region 6. This simplifies the manufacturing process. As shown in FIG. 13, the diffusion depth of heavily doped p-type impurity region 29 is smaller than the diffusion depth of medium-doped n-type impurity region 6, whereby a resistance against punch through can be improved.

Embodiment 2

Referring to FIGS. 14A and 14B to 18A and 18B, an embodiment 2 of the invention and a modification thereof will be described below. FIGS. 14A and 14B are cross sections showing a DRAM of the embodiment 2 of the invention.

In the memory cell portion of the embodiment 2, as shown in FIGS. 14A and 14B, one of source/drain of each MOS transistor is formed of only lightly doped n-type impurity region 5, and the other of source/drain is formed of lightly doped n-type impurity region 5 and a medium-doped n-type impurity region 6a. In the peripheral circuitry, each of the source/drain of the MOS transistor is formed of lightly doped n-type impurity region 5 and heavily doped n-type impurity region 7. Structures other than the above are the same as those shown in FIG. 1.

As shown in FIGS. 14A and 14B, the source or drain connected to bit line 16a is formed of only lightly doped n-type impurity region 5 so that the junction capacity can be reduced as compared with the embodiment 1, and also the resistance against punch through can be improved. Further, similarly to the embodiment 1, the leak current at the vicinity of region A can be reduced.

Referring to FIGS. 15A and 15B to 17A and 17B, a method of manufacturing the DRAM shown in FIGS. 14A and 14B will be described below. FIGS. 15A and 15B to 17A and 17B are cross sections showing distinctive 1st to 3rd steps in a process of manufacturing the DRAM shown in FIGS. 14A and 14B.

Figure 15A:
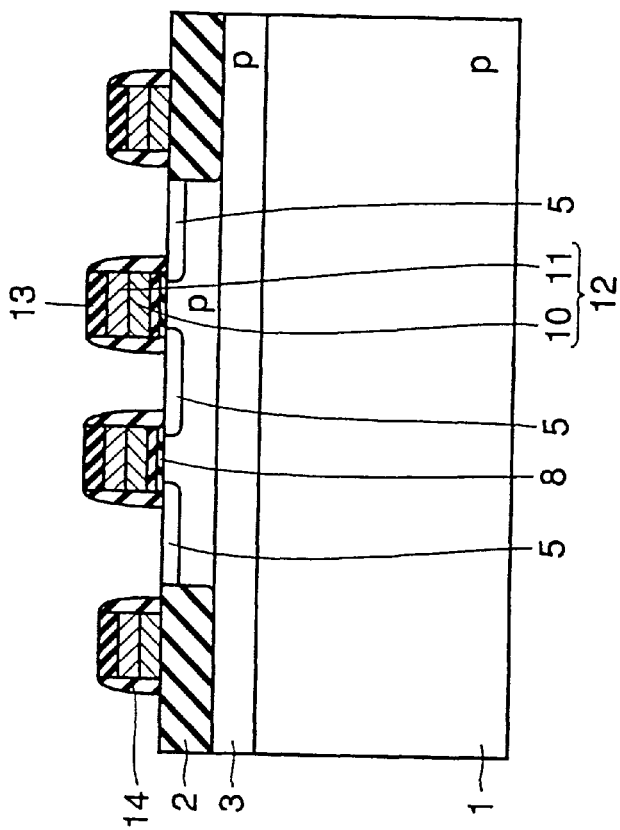
Figure 15B:
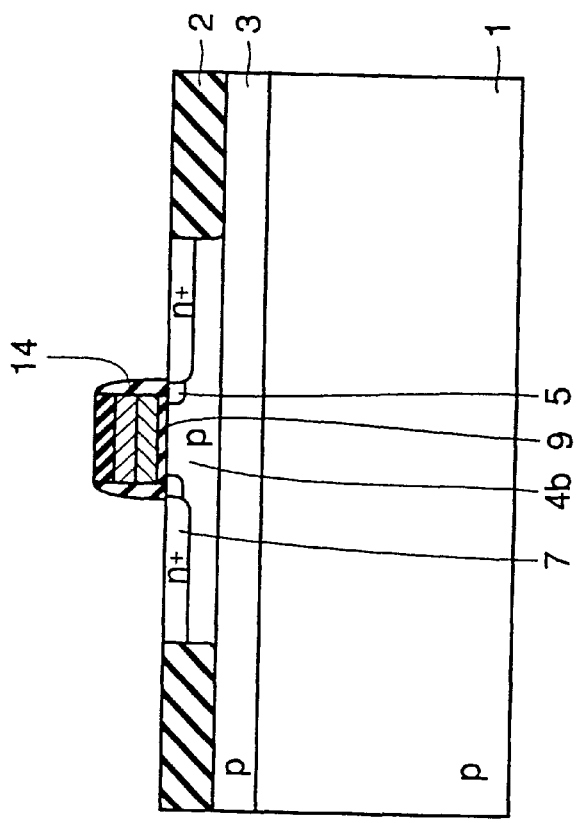

Referring to FIGS. 15A and 15B, steps similar to those of the embodiment 1 are performed to form lightly doped n-type impurity region 5 and others to be formed prior to the same. Then, side wall insulating film 14 is formed, and heavily doped n-type impurity region 7 is formed only in the peripheral circuitry. In this processing, heavily doped n-type impurity region 7 in the peripheral circuitry may be formed by implanting both arsenic and phosphorus. Thereby, the sheet resistance of the source/drain under side wall insulating film 14 can be reduced.

Figure 17A:
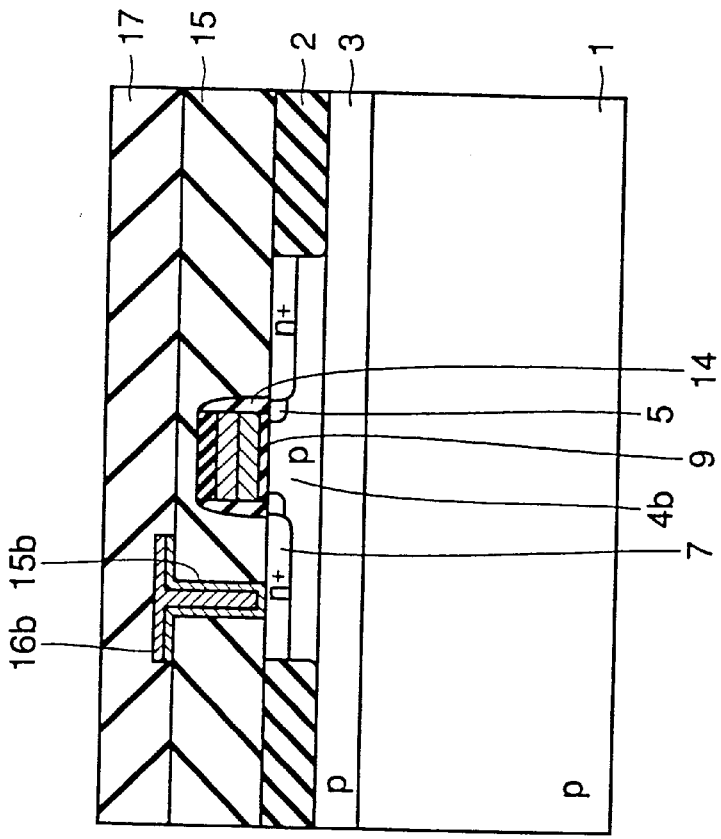
Figure 17B:
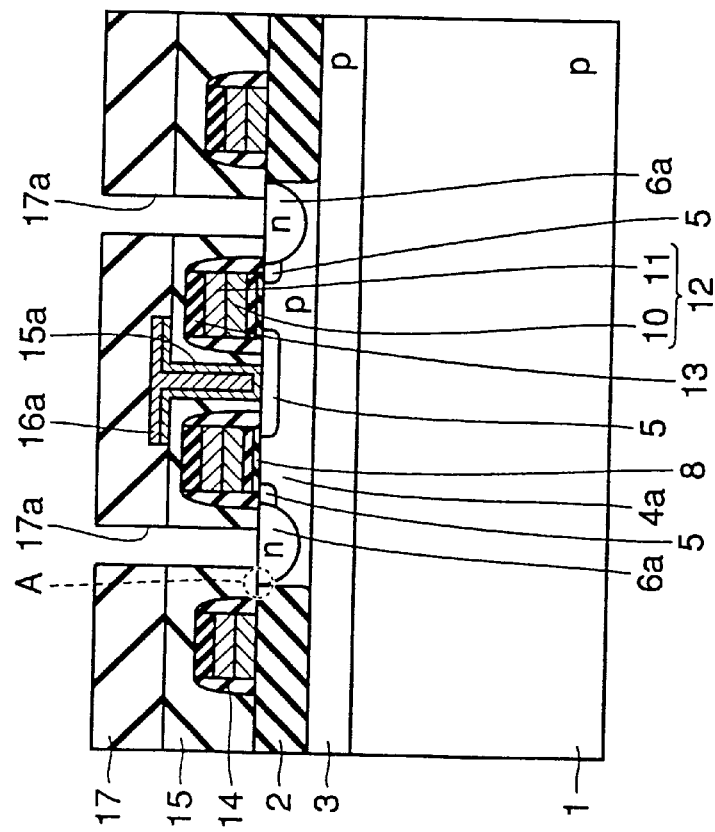

As shown in FIGS. 16A and 16B, bit line 16a and interconnection layer 16b as well as others to be formed before them are formed in the same manner as the embodiment 1. Interlayer insulating film 17 covering bit line 16a is formed, and contact holes 17a are formed as shown in FIGS. 17A and 17B. Through contact holes 17a, phosphorus ions are implanted with a dose of $3 \times 10^{13} - 5 \times 10^{14}$ atoms/cm$^2$ and 30–200 keV. Thereby, medium-doped n-type impurity regions 6a are formed. Thereafter, steps similar to those in the embodiment 1 are performed to complete the DRAM shown in FIGS. 14A and 14B.

Figure 18A:
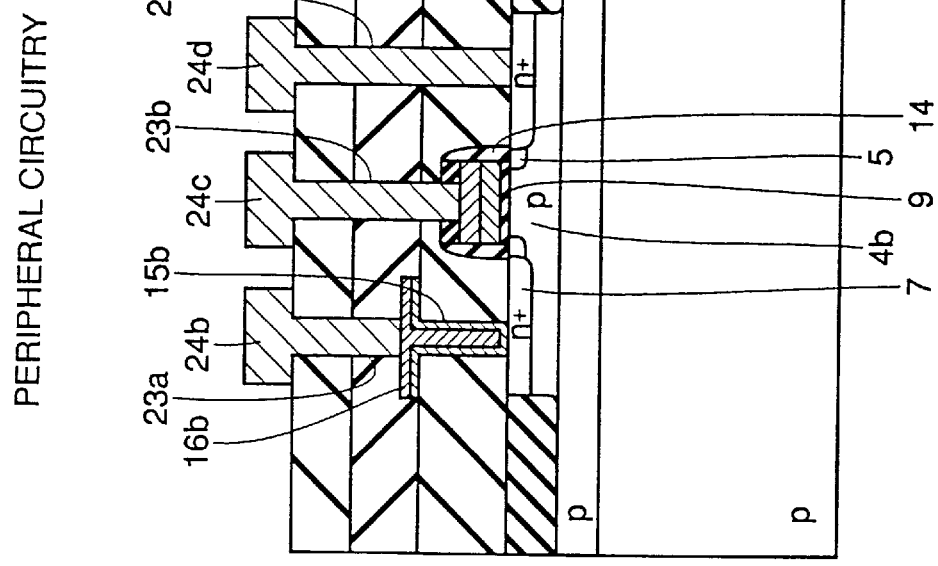
FIGS. 18A and 18B are cross sections showing a DRAM of a modification of the embodiment 2.
Figure 18B:
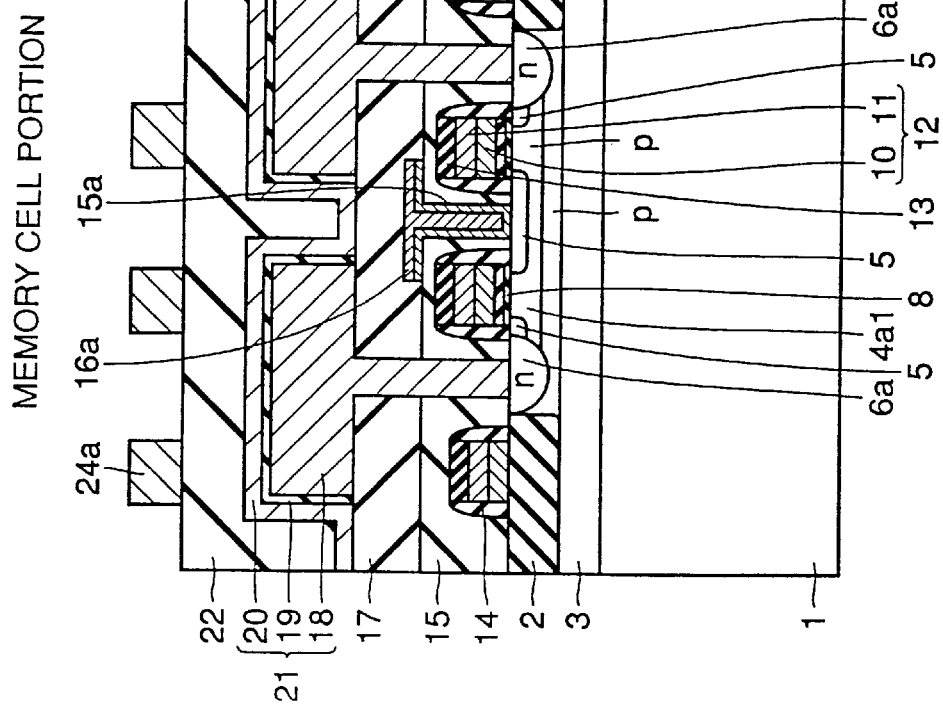

Referring to FIGS. 18A and 18B, a modification of the embodiment 2 will be described below. FIGS. 18A and 18B are cross sections showing the DRAM of this modification.

Referring to FIGS. 18A and 18B, p-type impurity region 4a1 in this modification is shallower than p-type impurity region 4b. In this structure, source/drain connected to bit line 16a is formed of only lightly doped n-type impurity region 5. Therefore, the junction leak current can be reduced more effectively than the structure shown in FIGS. 11A and 11B.

Embodiment 3

Figures 19A, 19B:
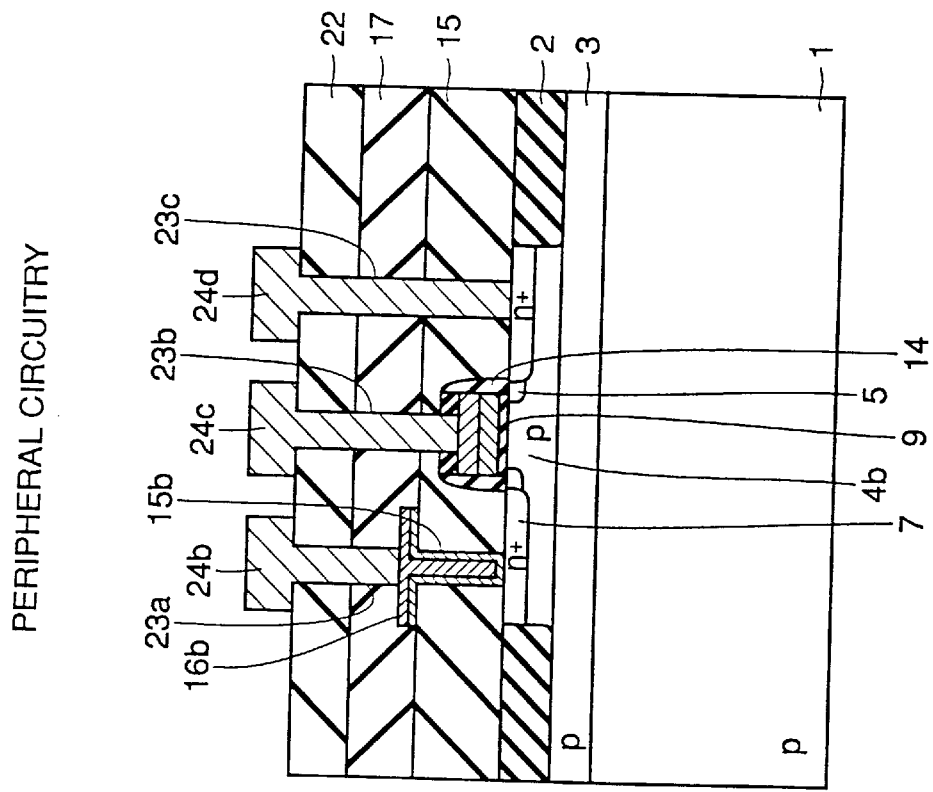
FIGS. 19A and 19B are cross sections showing a DRAM of an embodiment 3 of the invention.

Referring to FIGS. 19A and 19B as well as FIGS. 20A and 20B, description will be given on an embodiment 3 of the invention. FIGS. 19A and 19B are cross sections showing a DRAM of the embodiment 3 of the invention.

Referring to FIG. 19A and 19B, the structure of the embodiment 3 is provided with heavily doped n-type impurity region 7a which extends to a position under medium-doped n-type impurity region 6a in the embodiment 2. Heavily doped n-type impurity region 7a has a concentration from about $10^{18}$ to about $10^{20}$ atoms/cm$^3$, which is higher than the concentration of medium-doped n-type impurity region 6a. Heavily doped n-type impurity region 7a reaches the bottom of field insulating film 2.

Owing to provision of heavily doped n-type impurity region 7a described above, it is possible to reduce a leak current also at the vicinity of region B in FIGS. 19A and 19B. Thereby, the leak current can be reduced more effectively than the embodiment 2 already described.

Referring to FIG. 20A and 20B, description will be given on a method of manufacturing the DRAM shown in FIGS. 19A and 19B. FIGS. 20A and 20B are cross sections showing a distinctive step in a process of manufacturing the DRAM shown in FIGS. 19A and 19B.

Referring to FIGS. 20A and 20B, steps similar to those of the embodiment 2 are performed to form medium-doped n-type impurity region 6a and others to be formed prior to the same. Then, phosphorus ions are implanted through contact holes 17a with a dose from $3 \times 10^{13}$ to $5 \times 10^{14}$ atoms/cm$^2$ and 30–200 keV. Thereby, heavily doped n-type impurity regions 7a extending under medium-doped n-type impurity regions 6a are formed. Thereafter, steps similar to those in the embodiment 1 are performed to complete the DRAM shown in FIGS. 19A and 19B.

Embodiment 4

Referring to FIGS. 21A and 21B to 24A and 24B, an embodiment 4 of the invention will be described below. FIGS. 21A and 21B are cross sections showing a DRAM of the embodiment 4 of the invention.

In this embodiment 4, as shown in FIGS. 21A and 21B, a thin silicon oxide film 31 is formed to cover each gate electrode 12, and a silicon nitride film 30 is formed over silicon oxide film 31. A bit line 16a1 is made of metal such as W/TiN/Ti or the like. A titanium silicide film 32 is formed between bit line 16a1 and medium-doped n-type impurity region 6.

In the peripheral circuitry, interconnection layers 16b1 and 16c made of the same material as bit line 16a1 are formed. Titanium silicide film 32 is formed between interconnection layer 16b1 and heavily doped n-type impurity region 7. Metal interconnection 24c is connected to gate electrode 12 through interconnection layer 16c. Structures other than the above are the same as those shown in FIGS. 1A and 1B.

In the embodiment 4, silicon nitride film 30 covering each gate electrode 12 is formed as shown in FIGS. 21A and 21B. Silicon nitride film 30 is provided for forming, in a self-aligned manner, a contact hole 15a1 for connecting bit line 16a1 to medium-doped n-type impurity region 6. Provision of silicon nitride film 30 allows further miniaturization.

Owing to formation of titanium silicide film 32 at a contact portion of source/drain with bit line 16a1 or interconnection layer 16b1, it is possible to stabilize the contact resistance. In this structure, titanium silicide film 32 may be formed on the surface of medium-doped n-type impurity region 6 or the surface of heavily doped n-type impurity region 7. Thereby, it is possible to reduce the leak current compared with the case where titanium silicide film 32 is formed at the surface of the lightly doped impurity region.

Referring to FIGS. 22A and 22B to 24A and 24B, description will be given on a method of manufacturing the DRAM shown in FIGS. 21A and 21B. FIGS. 22A and 22B to 24A and 24B are cross sections showing distinctive 1st to 3rd steps in a process of manufacturing the DRAM shown in FIGS. 21A and 21B.

Figure 22A:
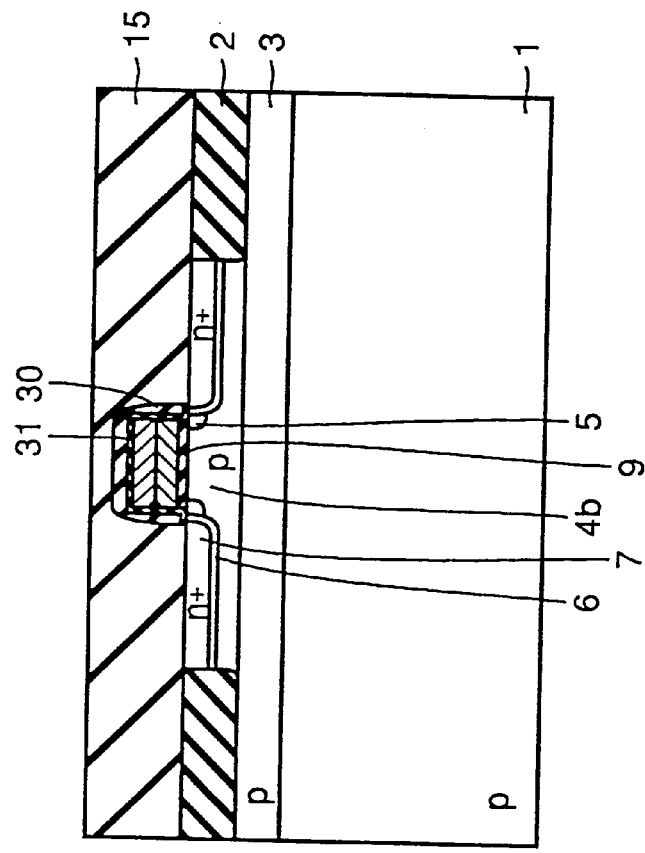
Figure 22B:
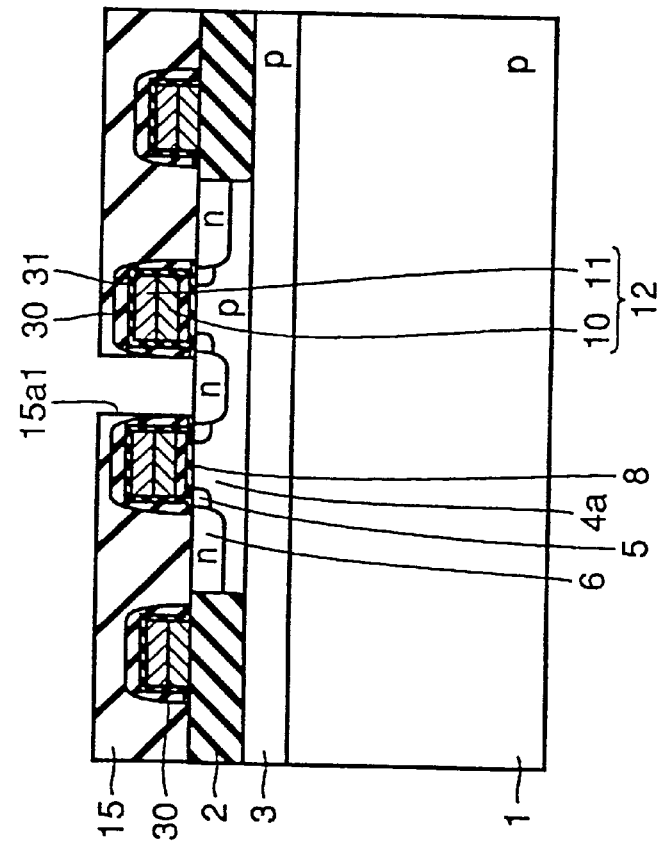

Referring to FIGS. 22A and 22B, steps similar to those of the embodiment 1 are performed to form gate insulating films 8 and 9 and others to be formed prior to the same. The polycrystalline silicon film, WSi film, silicon oxide film and silicon nitride film are successively deposited, and are patterned. Thereafter, lightly doped n-type impurity region 5 is formed in a manner similar to that in the embodiment 1. Then, silicon oxide film 31 is formed on the side wall of gate electrode 12, and the silicon nitride film is formed thereon. In this manner, silicon nitride films 30 shown in FIGS. 22A and 22B are formed. Using silicon nitride film 30 as a mask, medium-doped n-type impurity region 6 and heavily doped n-type impurity region 7 are formed in the same manner as the embodiment 1. Thereafter, interlayer insulating film 15 is formed, and contact hole 15a1 is formed only in the memory cell portion.

Referring to FIGS. 23A and 23B, contact holes 15b and 15c are formed in the peripheral circuitry. In this manner, contact hole 15a1 in the memory cell portion is formed in the step other than that of forming contact holes 15b and 15c in the peripheral circuitry, whereby it is possible to control more accurately the sizes and forms of contact hole 15a1 formed in a self-aligned manner and contact hole 15c.

Referring to FIGS. 24A and 24B, the titanium film, TiN film and W film are successively formed, and a heat treatment is effected. Thereby, titanium silicide film 32 is formed at a portion in contact with semiconductor substrate 1. Thereafter, the layered structure thus formed is patterned. Thereby, bit line 16a1 and interconnection layers 16b1 and 16c are formed. Thereafter, steps similar to those in the embodiment 1 are performed to complete the DRAM shown in FIG. 21A and 21B. A medium-doped n-type impurity region 6a may be formed in place of medium-doped n-type impurity region 6 located immediately under bit line 16a1.

Embodiment 5

Figure 25A:
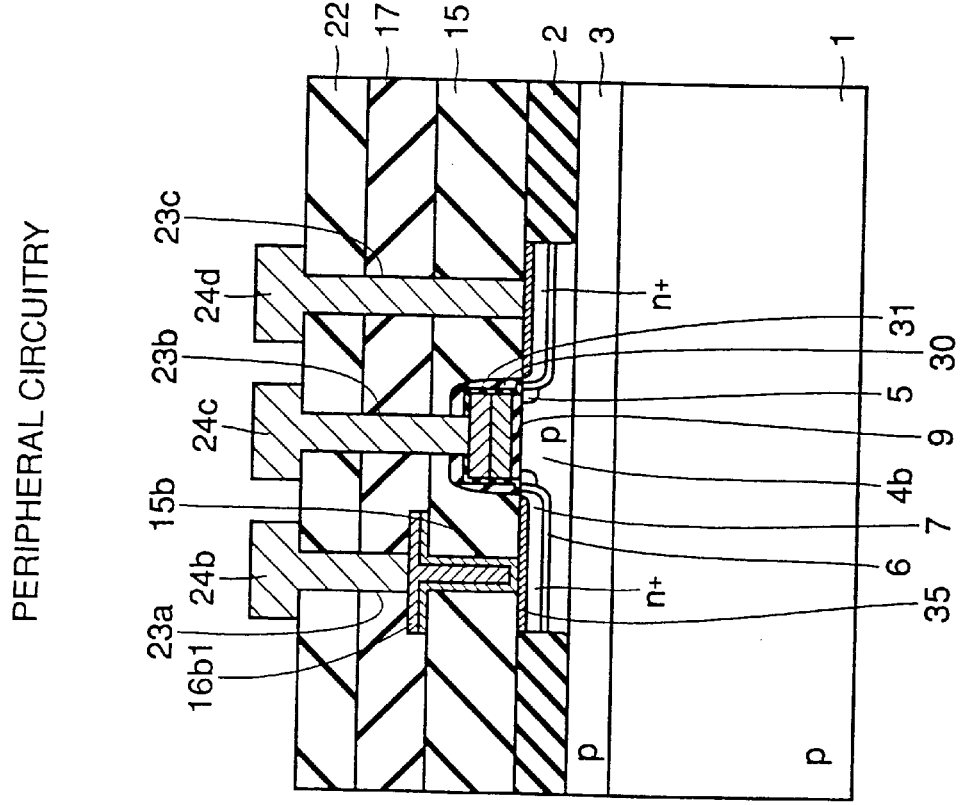
FIGS. 25A and 25B are cross sections showing a DRAM of an embodiment 5 of the invention.
Figure 25B:
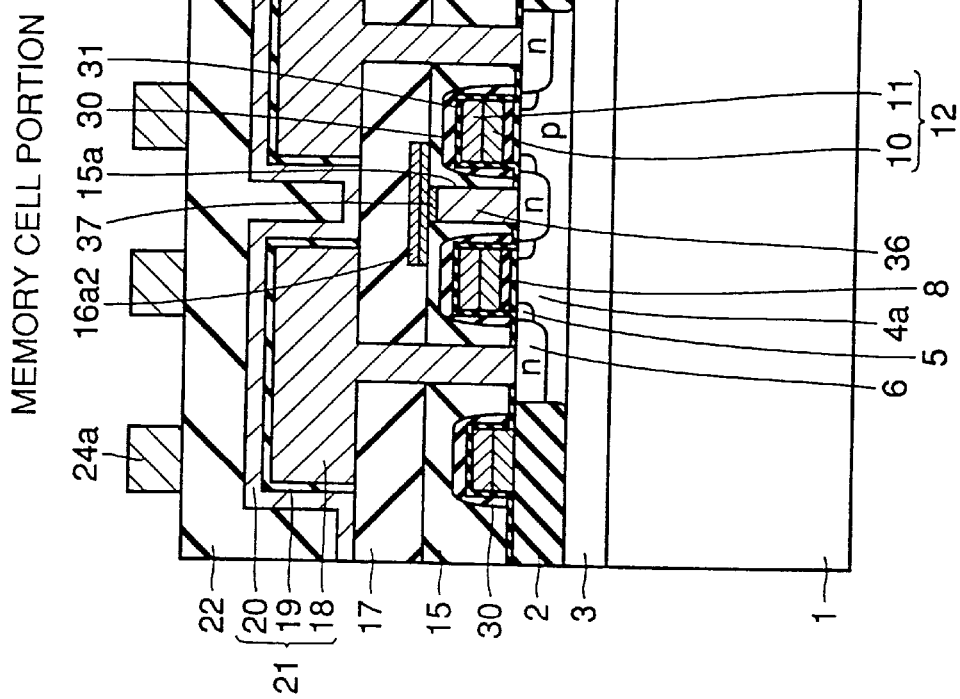

Referring to FIGS. 25A and 25B to 33A and 33B, description will be given on an embodiment 5 of the invention and a modification thereof. FIGS. 25A and 25B are cross sections showing a DRAM of the embodiment 5 of the invention.

In the embodiment 5, as shown in FIGS. 25A and 25B, a polycrystalline silicon plug 36 is formed in contact hole 15a, and a bit line 16a2 is formed on polycrystalline silicon plug 36 with a titanium silicide film 37 therebetween. Bit line 16a2 is made of a material similar to that of bit line 16a1.

In the peripheral circuitry, a titanium silicide film 35 is formed at the surface of heavily doped n-type impurity region 7. Metal interconnection 24c is directly connected to gate electrode 12. Structures other than the above are the same as those shown in FIGS. 21A and 21B.

By forming titanium silicide film 37 on polycrystalline silicon plug 36 as described above, it is possible to form the titanium silicide film which is thicker than titanium silicide film 32 shown in FIGS. 21A and 21B. This is because that the titanium film for forming titanium silicide film 32 is usually formed by the sputtering method, and therefore it is difficult to increase its thickness at the bottom of contact hole 15a1. In the peripheral circuitry, titanium film 35 can likewise be thicker than that in the embodiment 4 by the same reason. Owing to formation of thick titanium silicide films 35 and 37 as described above, it is possible to suppress effectively the increase in junction leak current and contact resistance, which may be caused due to condensation of the titanium silicide film when a heat treatment at about 800° C. or more is performed in a later step.

In FIGS. 25A and 25B, medium-doped n-type impurity region 6 immediately under polycrystalline silicon plug 36 may likewise be eliminated. Although the titanium silicide film is used in the embodiments 4 and 5, another metal silicide film, e.g., of cobalt silicide may be used.

Referring to FIGS. 26A and 26B to 30A and 30B, description will be given on a method of manufacturing the DRAM shown in FIGS. 25A and 25B. FIGS. 26A and 26B to 30A and 30B are cross sections showing distinctive 1st to 5th steps in a process of manufacturing the DRAM shown in FIGS. 25A and 25B.

Figure 26A:
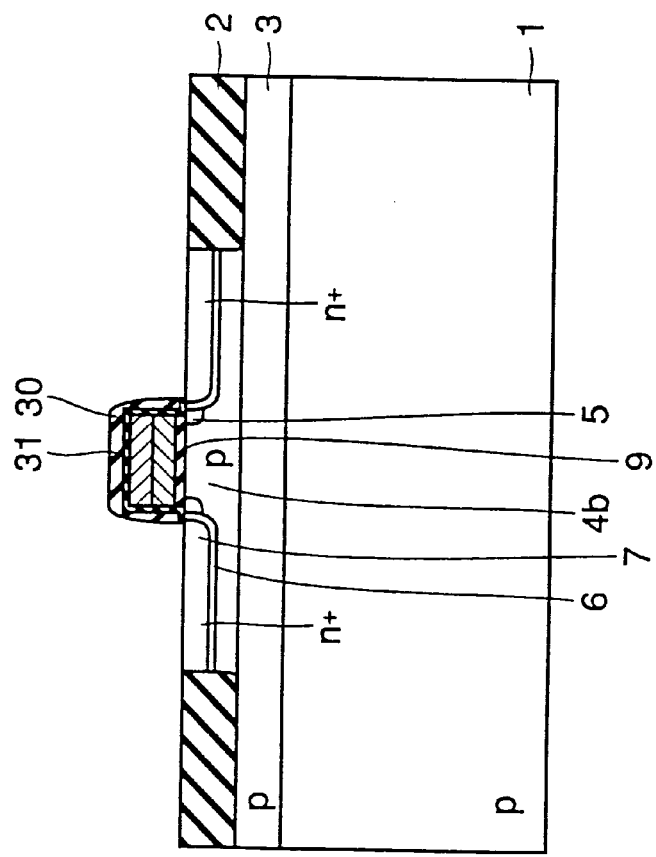
Figure 26B:
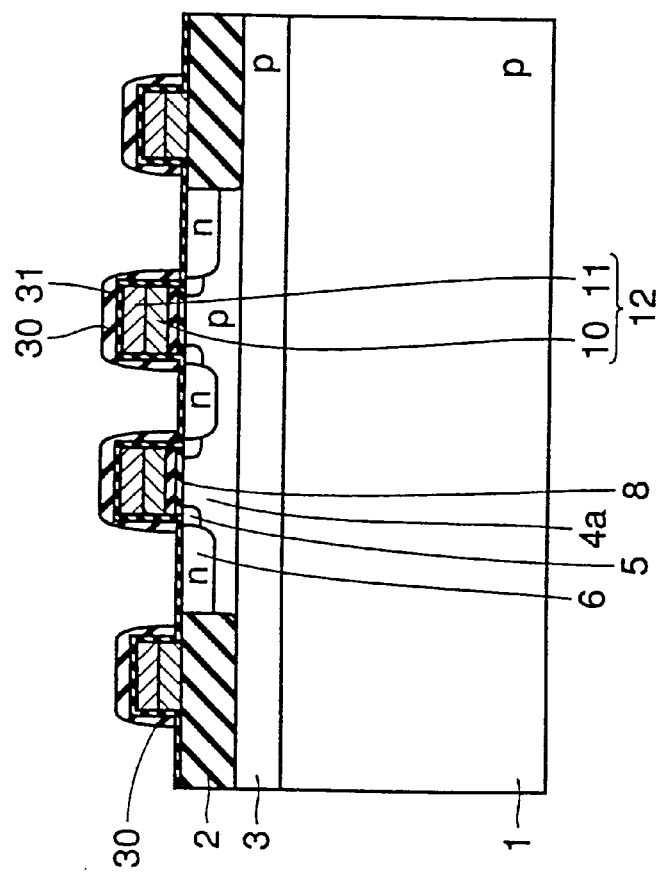

Referring to FIGS. 26A and 26B, steps similar to those of the embodiment 4 are performed to form heavily doped n-type impurity region 7 and others to be formed prior to the same. These steps are performed to left silicon oxide film 31 covering the surface of medium-doped n-type impurity region 6 in the memory cell portion. Thereby, it is possible to prevent a damage against semiconductor substrate 1 due to the etching of silicon nitride film 30.

As shown in FIGS. 27A and 27B, titanium film 34 is formed on the entire surface by the sputtering method or the like. In this processing, silicon oxide film 31 covering medium-doped n-type impurity region 6 is already present in the memory cell portion so that medium-doped n-type impurity region 6 is not in contact with titanium film 34. In the peripheral circuitry, however, heavily doped n-type impurity region 7 is in contact with titanium film 34. In this state, lamp annealing is effected on titanium film 34.

Figure 28A:
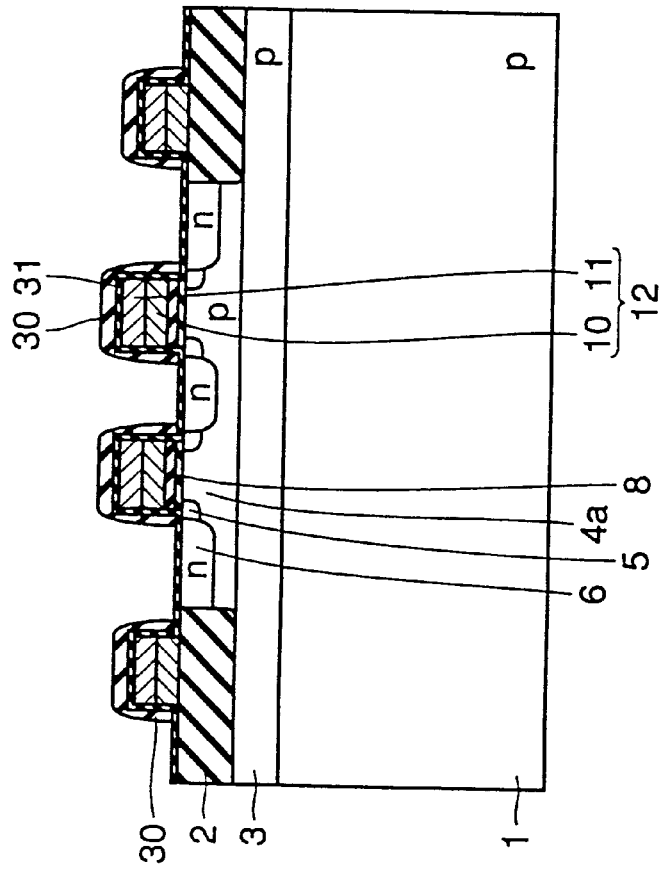
Figure 28B:
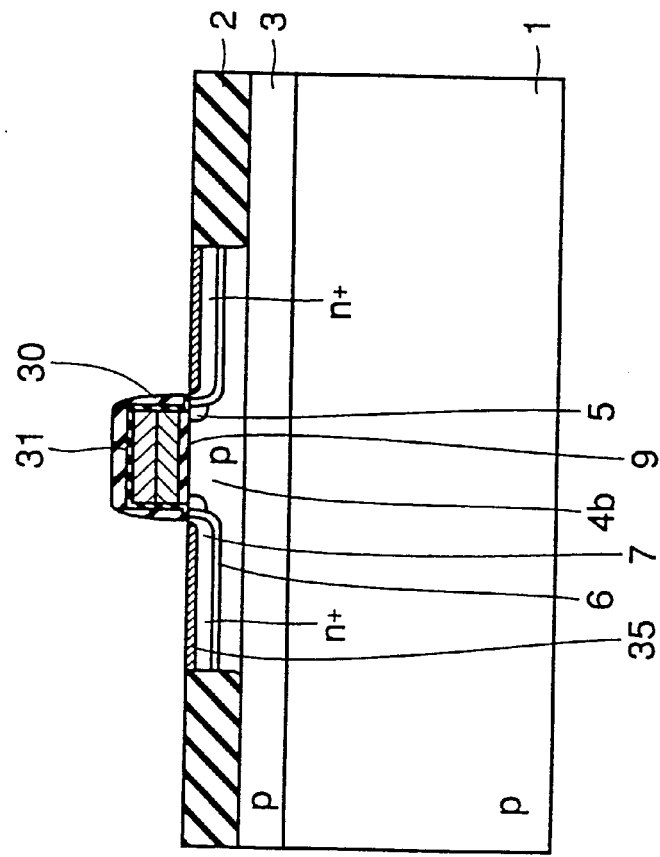

Then, as shown in FIGS. 28A and 28B, the above lamp annealing forms titanium silicide film 35 in a self-aligned manner at the surface of heavily doped n-type impurity region 7 in the peripheral circuitry.

Figure 29A:
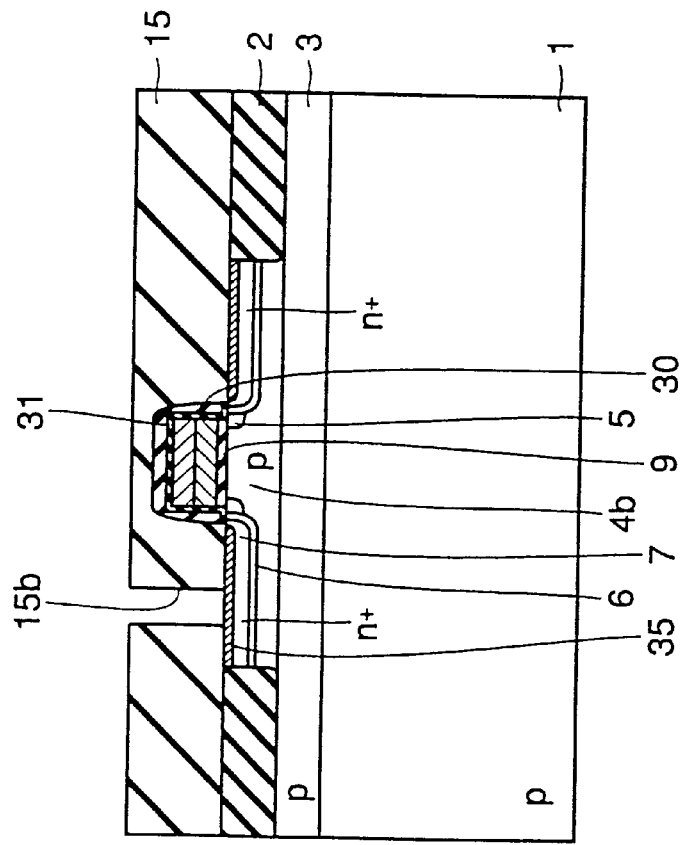
Figure 29B:
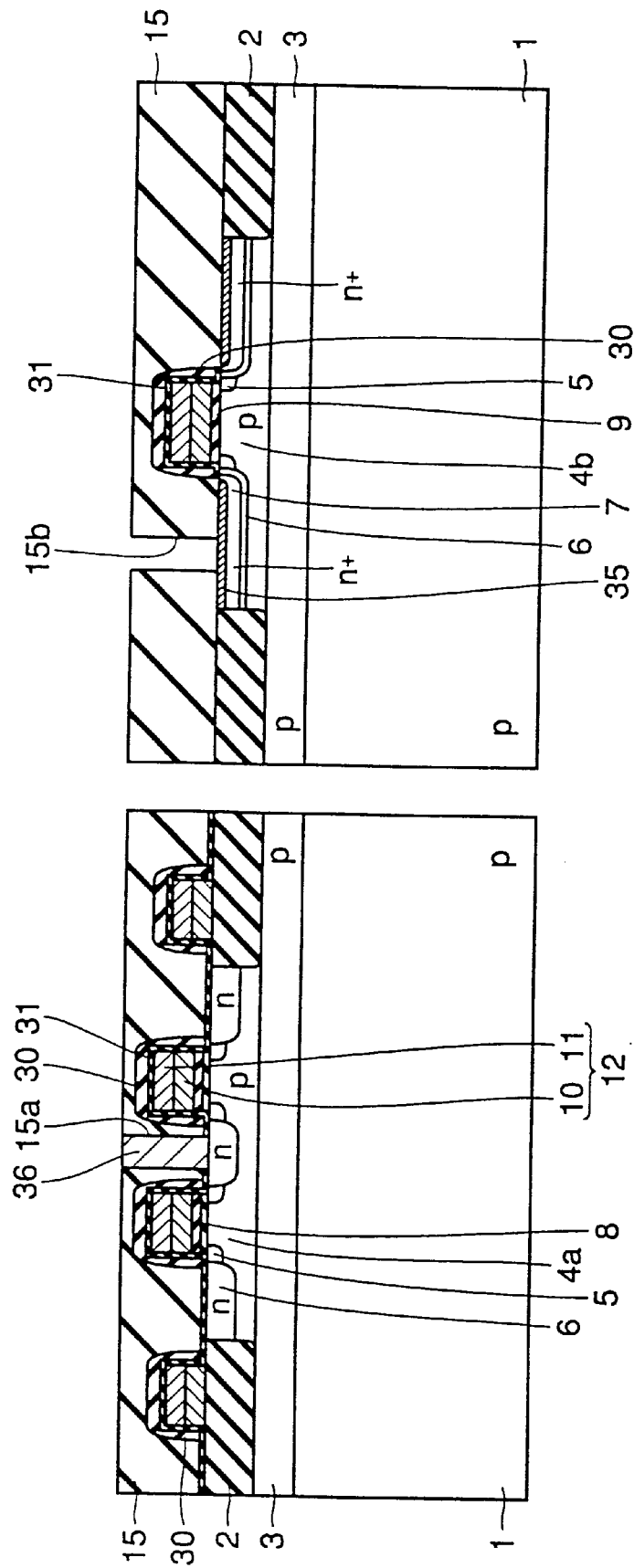
Figure 30A:
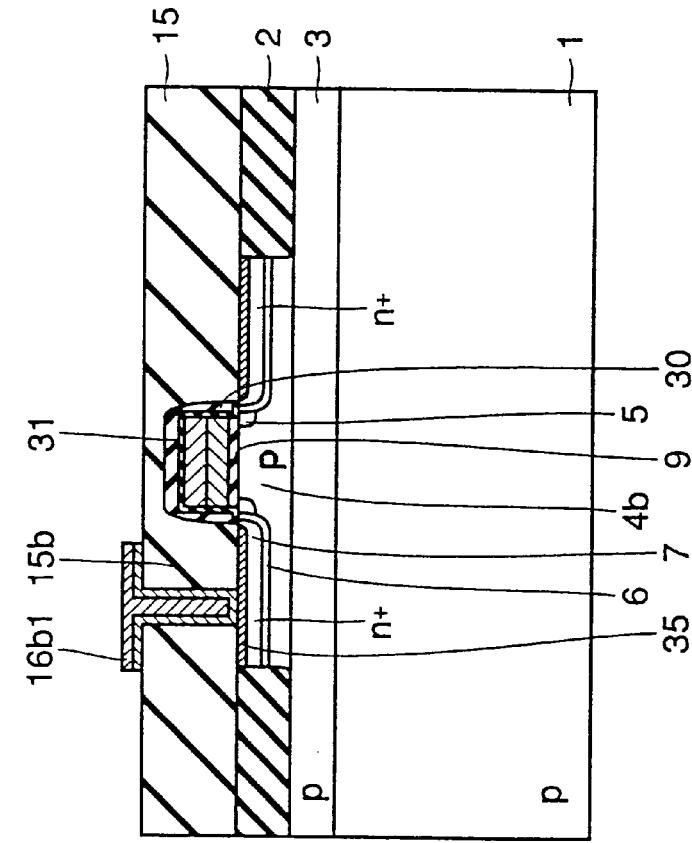
Figure 30B:
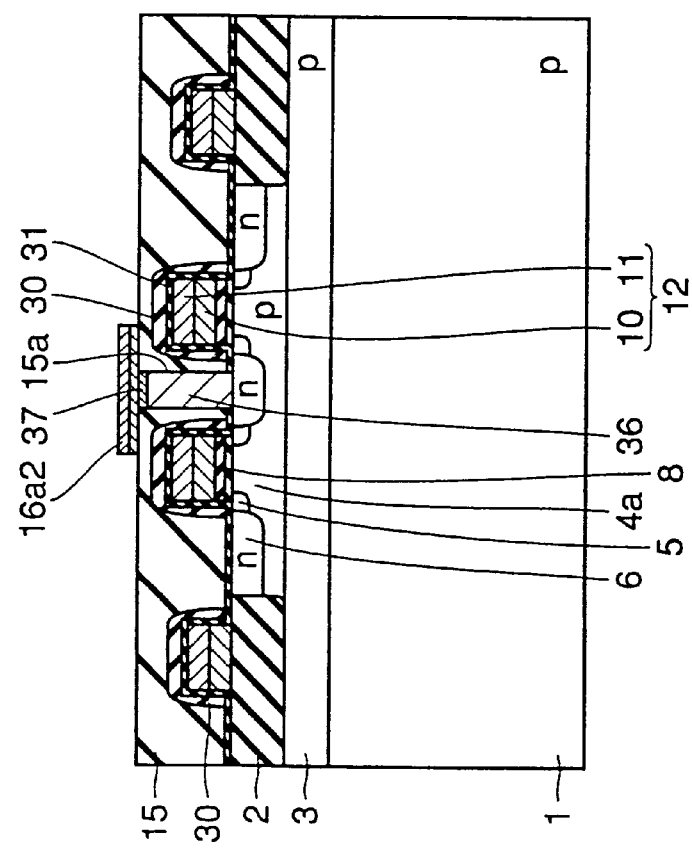

Then, as shown in FIGS. 29A and 29B, contact hole 15a is formed in the memory cell portion after forming interlayer insulating film 15. Polycrystalline silicon plug 36 is formed in contact hole 15a. Thereafter, contact hole 15b is formed in the peripheral circuitry.

Then, titanium silicide film 37 is formed at the surface of polycrystalline silicon plug 36, and bit line 16a2 and interconnection layer 16b1 are formed in a manner similar to that in the embodiment 4. Thereafter, steps similar to those in the embodiment 1 are performed to complete the DRAM shown in FIG. 25.

Figures 31A, 31B:
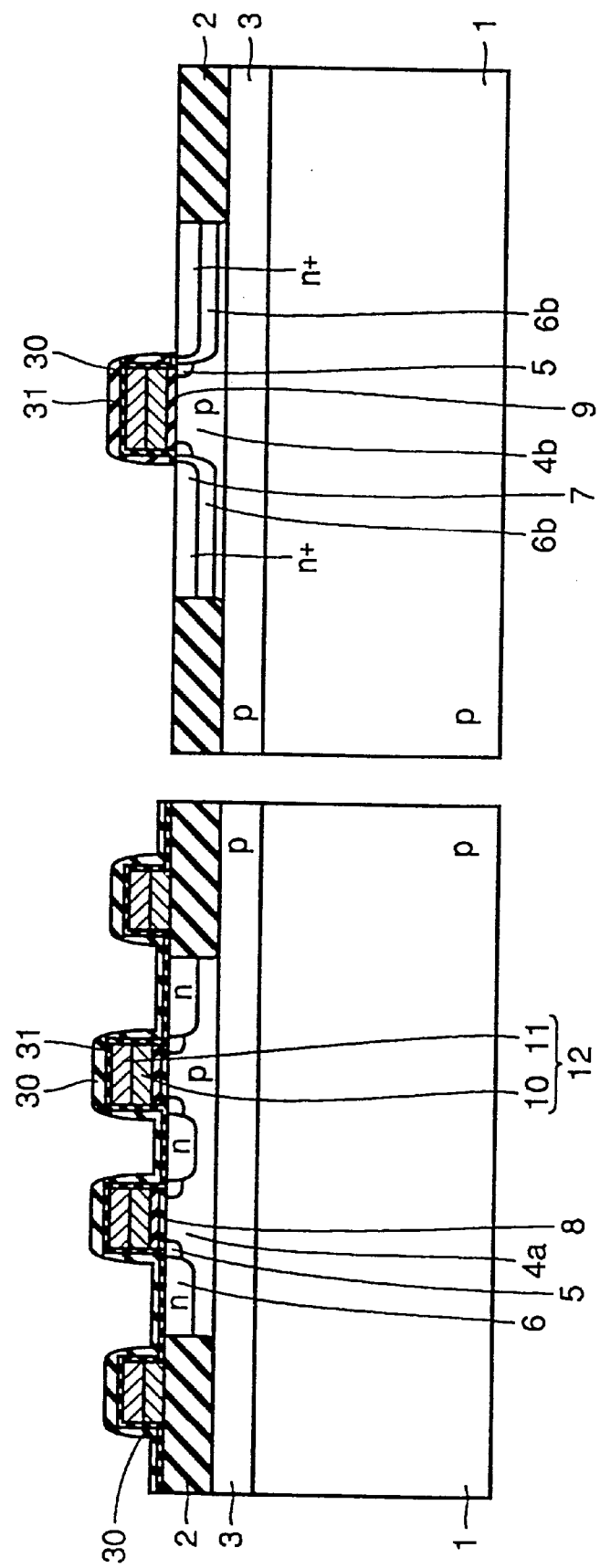
FIGS. 31A, 31B, 32A and 32B show first and second steps in a modification of a process of forming a titanium silicide film.

Referring to FIGS. 31A and 31B to 33A and 33B, the modification of the embodiment 5 will be described below. FIGS. 31A and 31B to 33A and 33B are cross sections showing distinctive steps in this modification. In this modification, as shown in FIGS. 31A and 31B, silicon nitride film 30 is left on the surface of semiconductor substrate 1 located between gate electrodes 12 in the memory cell portion. In this state, medium-doped n-type impurity region 6 is formed. Thereby, medium-doped n-type impurity region 6b having a larger diffusion depth than that in the memory cell portion is formed in the peripheral circuitry. Owing to provision of medium-doped n-type impurity region 6b at a deep position, it is possible to suppress effectively punching of heavily doped n-type impurity region 7, which will be formed in a later step, through medium-doped n-type impurity region 6b. Similarly to the case shown in FIGS. 26A and 26B, an etching damage to the surface of the semiconductor substrate in the memory cell portion can be effectively suppressed.

Figure 32A:
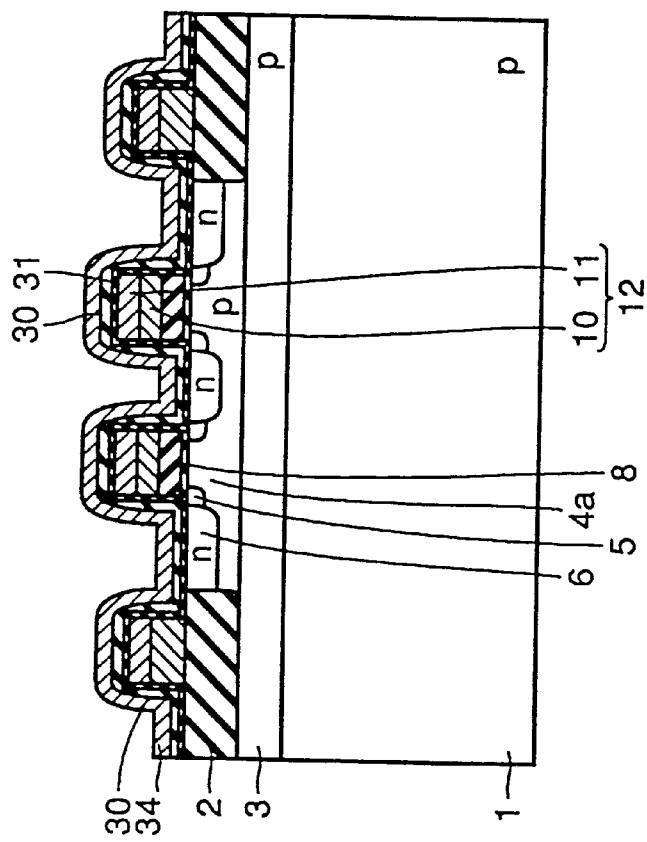
Figure 32B:
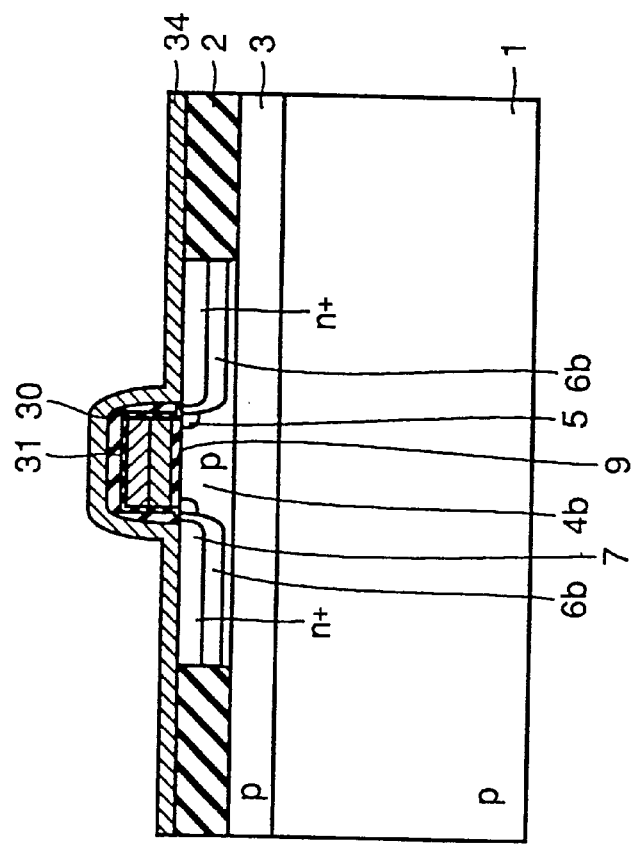

Referring to FIGS. 32A and 32B, titanium film 34 is formed on the entire surface after forming heavily doped n-type impurity region 7 in the peripheral circuitry. In this state, lamp annealing is effected on titanium film 34. Thereby, titanium silicide film 35 is formed.

Figure 33B:
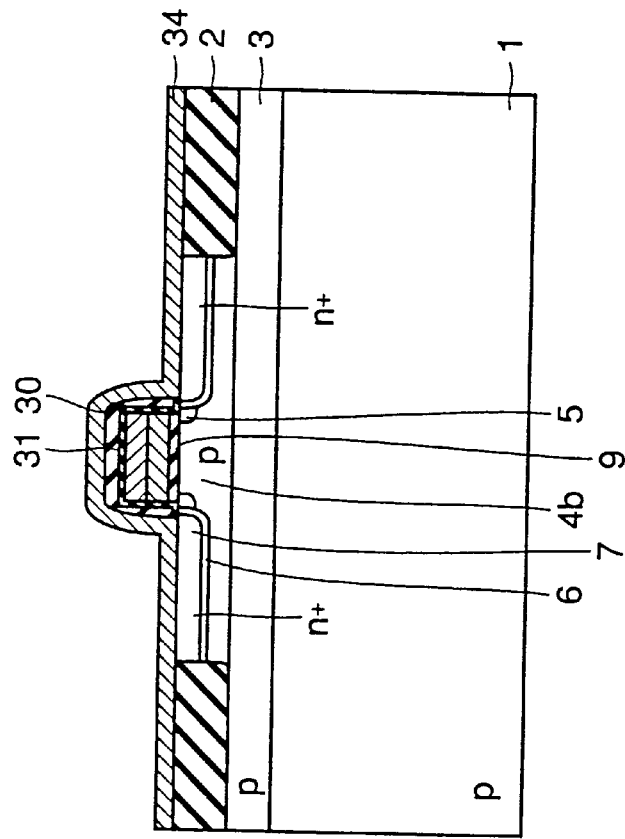
FIGS. 33A and 33B are cross sections showing another modification of the method of forming the titanium silicide film.
Figure 33A:
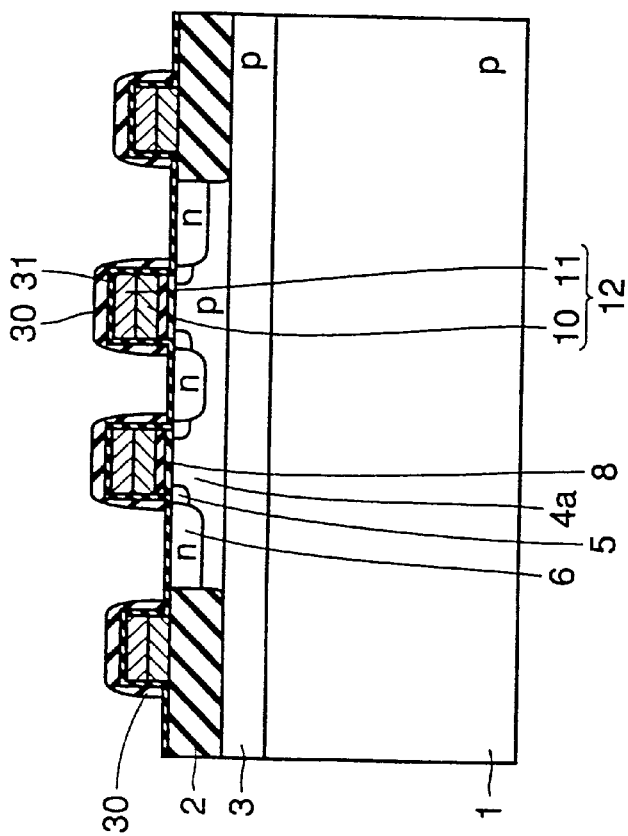

Subsequently to the step of forming titanium film 34 on the entire surface, the foregoing lamp annealing may be effected after selectively removing titanium film 34 in the memory cell portion, as shown in FIGS. 33A and 33B. In this case, titanium silicide film 35 may likewise be formed selectively on the surface of heavily doped n-type impurity region 7.

Embodiment 6

Figure 34:
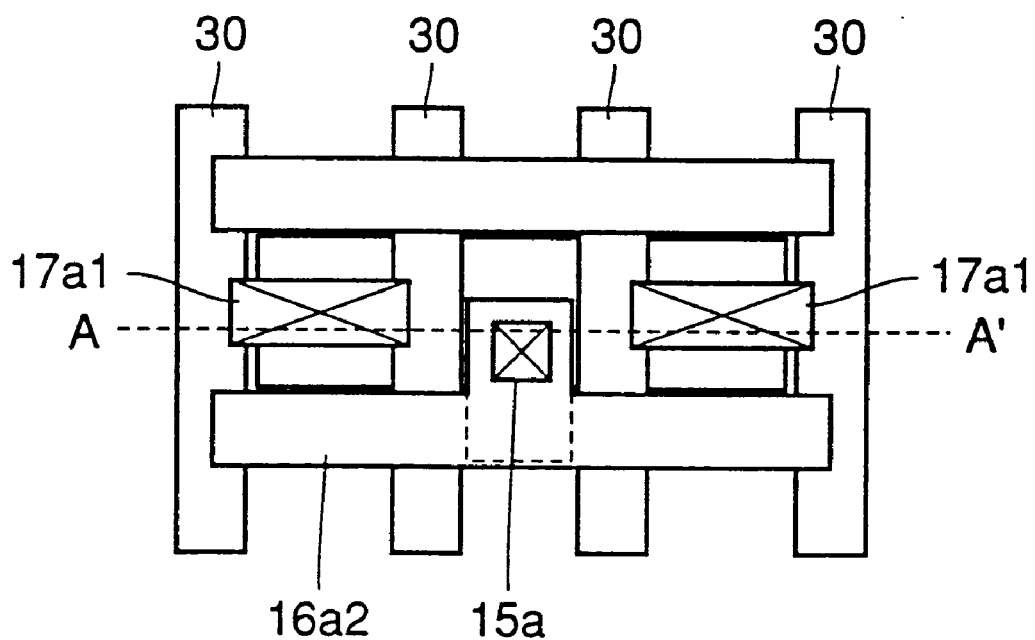
FIG. 34 is a plan showing a memory cell portion in a DRAM of an embodiment 6 of the invention.

Referring to FIGS. 34 to 36A and 36B, an embodiment 6 of the invention will be described below. FIG. 34 is a plan showing a memory cell portion of a DRAM of the embodiment 6 of the invention. FIGS. 35A and 35B are cross sections showing the DRAM of the embodiment 6.

Figure 35A:
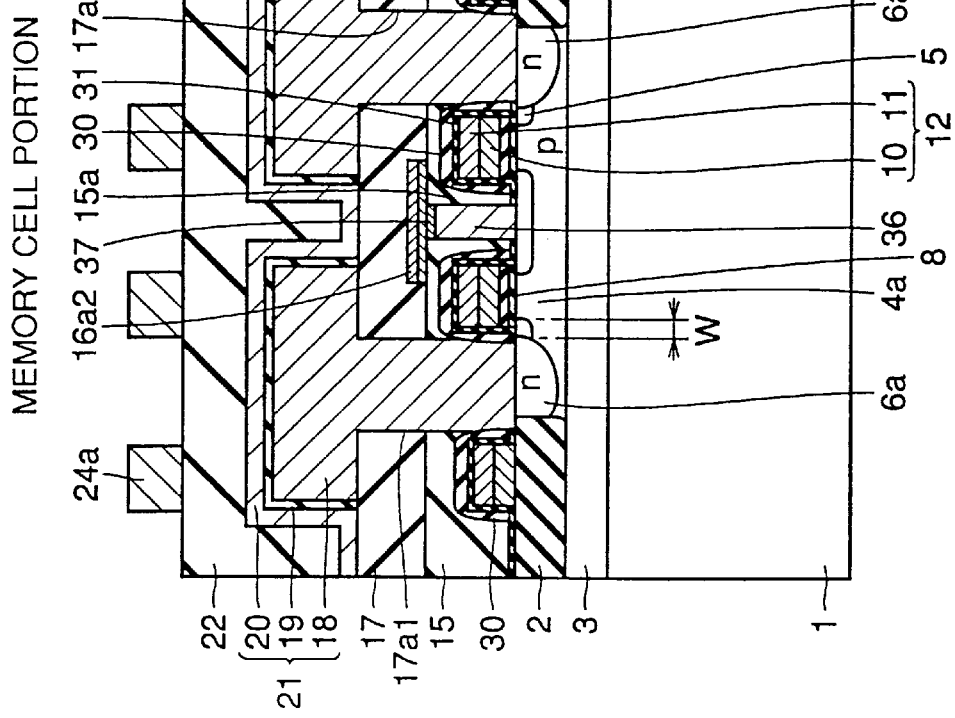
FIGS. 35A and 35B are cross sections showing the DRAM of the embodiment 6 of the invention.
Figure 35B:
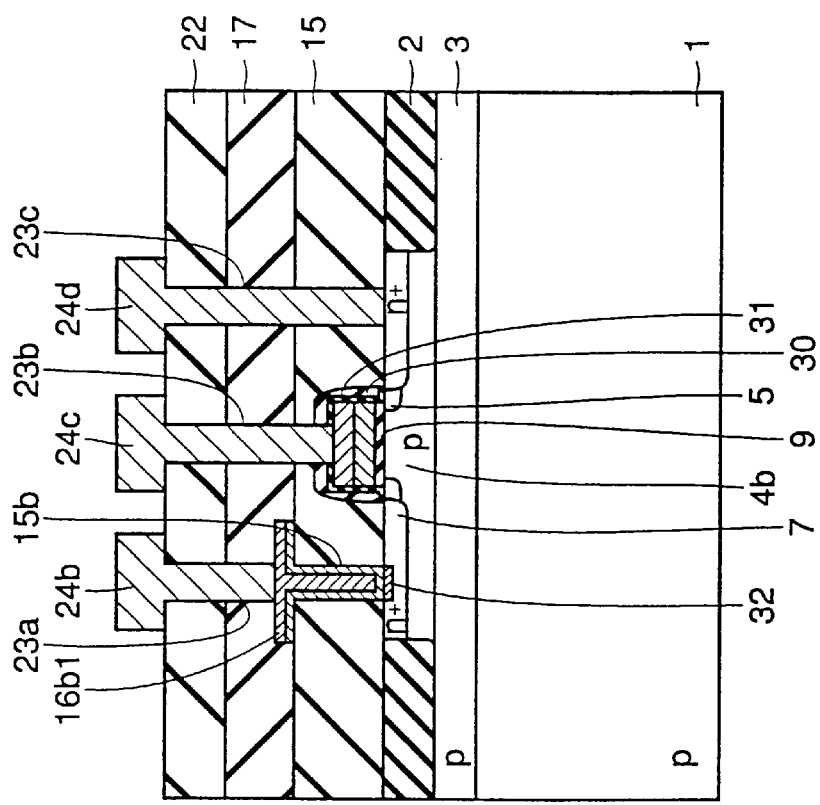
Figures 37A, 37B:
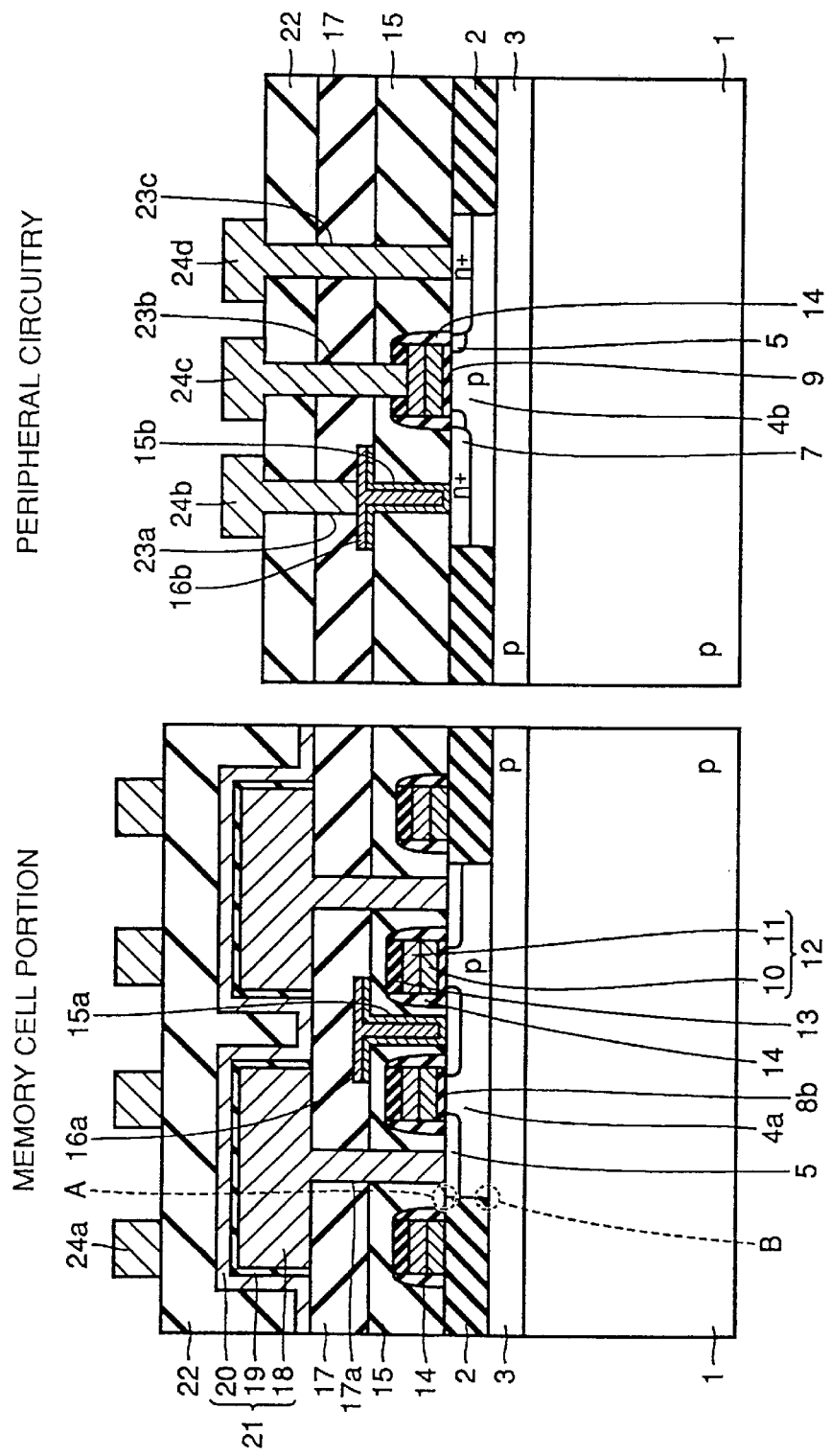
FIGS. 37A and 37B are cross sections showing by way of example a conventional DRAM.

FIGS. 35A and 35B are cross sections taken along line A-A' in FIG. 34, and show the memory cell portion.

In this embodiment 6, contact holes 17a1 are provided for connecting storage nodes 18 to medium-doped n-type impurity regions 6a, respectively. Each contact hole 17a1 reaches silicon nitride films 30 located at the opposite sides thereof. Etching is effected on silicon nitride film 30 on the side wall of gate electrode 12, for example, with a ($CF_4+O_2$) gas. Owing to this, a width W of lightly doped n-type impurity region 5, which continues to medium-doped n-type impurity region 6a, can be reduced. Thereby, a sheet resistance of source/drain can be reduced, and deterioration in transistor characteristics can be suppressed.

As shown in FIG. 34 and FIGS. 35A and 35B, contact hole 17a1 reaches field insulating film 2. However, it is possible to reduce a leak current at the vicinity of the periphery of field insulating film 2, which may occur due to a stress in the foregoing region A and an etching damage during formation of contact hole 17a1 by existence of medium-doped n-type impurity regions 6a. Even if the etching damage is applied to the main surface of semiconductor substrate 1 during formation of contact hole 17a1, it is possible to reduce the etching damage by slightly shaving off the main surface of semiconductor substrate 1, e.g., with a ($CF_4+O_2$) gas.

Referring to FIGS. 36A and 36B, a modification of the embodiment 6 will be described below. FIGS. 36A and 36B are cross sections showing the DRAM of a modification of the embodiment 6.

In this modification, as shown in FIGS. 36A and 36B, field insulating film 2 is partially etched when forming contact hole 17a1. Thereby, concavities 38 are formed at field insulating film 2. By partially removing the periphery of field insulating film 2, it is possible to reduce a leak current due to a stress which is caused by formation of field insulating film 2. In addition to this, a contact area between the storage node and medium-doped n-type impurity region 6a can be increased so that the contact resistance can be improved. In the above modifications and embodiment 6, another silicide such as cobalt silicide can be used instead of titanium silicide.

According to the invention, as described above, the junction leak current can be reduced. Thereby, the semiconductor device can have a high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a main surface;
   first and second impurity regions of a first conductivity type formed spaced apart from each other in said main surface of said semiconductor substrate;
   a first transistor formed on said first impurity region, and having a gate insulating film of a first thickness, at least one of source and drain of said first transistor being formed of a first lightly doped region of a second conductivity type and a first heavily doped region of the second conductivity type; and
   a second transistor formed on said second impurity region, and having a gate insulating film of a second thickness smaller than said first thickness, at least one of source and drain of said second transistor including a second lightly doped region of the second conductivity type and a second heavily doped region of the second conductivity type, wherein
   said second heavily doped region is higher in concentration than said first heavily doped region, and a concentration of said first impurity region is lower than a concentration of said second impurity region.

2. The semiconductor device according to claim 1, wherein
   at least one of the source/drain of said second transistor has a medium-doped region having a concentration higher than said second lightly doped region and lower than said second heavily doped region.

3. The semiconductor device according to claim 1, wherein
   said semiconductor device includes a memory cell portion for storing data and a peripheral circuit portion for external input/output,
   said memory cell portion includes said first transistor, and
   said peripheral circuit portion includes said second transistor.

4. The semiconductor device according to claim 2, wherein
   a diffusion depth of said second heavily doped region is smaller than a diffusion depth of said medium-doped region.

5. The semiconductor device according to claim 1, wherein
   a field insulating film is formed in contact with said first heavily doped region,
   said first and second transistors are covered with an interlayer insulating film having a contact hole reaching said first heavily doped region and said field insulating film, and
   a concavity is formed at said field insulating film located immediately under said contact hole, and
   a storage node is formed in said concavity and on said first heavily doped region.

6. A semiconductor device comprising:
   a semiconductor substrate having a main surface;
   a first impurity region of a first conductivity type having a peak concentration at a position of a first depth from said main surface;
   a second impurity region of the first conductivity type having a peak concentration at a position of a second depth larger than said first depth from said main surface; and being spaced from said first impurity region;
   a first transistor formed on said first impurity region, and having a gate insulating film of a first thickness; and
   a second transistor formed on said second impurity region, and having a gate insulating film of a second thickness smaller than said first thickness, wherein
   a concentration of said first impurity region is lower than a concentration of said second impurity region.

7. The semiconductor device according to claim 6, wherein
   a third impurity region lower in concentration than said first impurity region is formed under said first impurity region,
   said first transistor has a pair of first source/drain, at least one of said first source/drain reaches said third impurity region, said second transistor has a pair of second source/drain, and said second source/drain have diffusion depths smaller than said second depth.

8. A semiconductor device comprising:

a semiconductor substrate having a main surface;

first and second impurity regions of a first conductivity type formed spaced apart from each other in said main surface of said semiconductor substrate;

a first transistor formed on said first impurity region, having a gate insulating film of a first thickness, and having third and fourth impurity regions of a second conductivity type constituting source and drain regions, respectively, said third impurity region having a first diffusion depth and said fourth impurity region having a second diffusion depth smaller than said first diffusion depth; and a second transistor formed on said second impurity region, having a gate insulating film of a second thickness smaller than said first thickness, and having fifth and sixth impurity regions of a second conductivity type forming source and drain regions, respectively, said fifth and sixth impurity regions having diffusion depths smaller than said first diffusion depth and not smaller than said second diffusion depth; wherein a concentration of said first impurity region is lower than a concentration of said second impurity region.

9. The semiconductor device according to claim 8, wherein a concentration of said third impurity region having said first diffusion depth is higher than a concentration of said fourth impurity region, and a field insulating film is formed in contact with said third impurity region.

* * * * *